(12) United States Patent
Muto et al.

(10) Patent No.: US 7,053,670 B2
(45) Date of Patent: May 30, 2006

(54) SEMICONDUCTOR INTEGRATED CIRCUIT DEVICE AND SEMICONDUCTOR INTEGRATED CIRCUIT

(75) Inventors: Takashi Muto, Hamura (JP); Toshiro Takahashi, Hamura (JP)

(73) Assignee: Hitachi, Ltd., Tokyo (JP)

( * ) Notice: Subject to any disclaimer, the term of this patent is extended or adjusted under 35 U.S.C. 154(b) by 54 days.

(21) Appl. No.: 10/751,917

(22) Filed: Jan. 7, 2004

(65) Prior Publication Data

US 2004/0150459 A1 Aug. 5, 2004

(30) Foreign Application Priority Data

Jan. 8, 2003 (JP) ............................. 2003-001825

(51) Int. Cl.
 *H03K 5/22* (2006.01)
(52) U.S. Cl. .......................................... 327/65; 327/63
(58) Field of Classification Search .................. 327/50, 327/52, 55, 63, 65, 563
 See application file for complete search history.

(56) References Cited

U.S. PATENT DOCUMENTS

| | | | | |
|---|---|---|---|---|
| 4,577,162 | A * | 3/1986 | Peterson ...................... | 330/253 |
| 5,032,744 | A * | 7/1991 | Wai Yeung Liu ............. | 327/55 |
| 5,990,707 | A * | 11/1999 | Goldenberg et al. .......... | 327/64 |
| 6,081,166 | A * | 6/2000 | Katakura ...................... | 331/57 |
| 6,154,511 | A * | 11/2000 | Nakamura et al. .......... | 375/375 |
| 6,456,120 | B1 * | 9/2002 | Huang ......................... | 326/115 |
| 6,459,306 | B1 * | 10/2002 | Fischer et al. ................ | 327/67 |
| 6,529,070 | B1 * | 3/2003 | Nagaraj ......................... | 330/9 |
| 6,617,899 | B1 * | 9/2003 | Cyrusian ..................... | 327/199 |
| 6,628,224 | B1 * | 9/2003 | Mulder et al. .............. | 341/156 |

OTHER PUBLICATIONS

Kudoh, Yoshiharu, et al., "A 0.13-μm CMOS 5-Gb/s 10-meter 28AWG Cable transceiver with no-feedback-loop continuous-time post-equalizer", 2002 IEEE Symposium on VLSI Circuits Digest of Technical Papers, pp. 64-67.

Savoj, Jafar, "A 10Gb/s CMOS Clock and Data Recovery Circuit with Frequency Detection", Digest of Technical Papers, 2001 IEEE International Solid-State Circuits Conference, Feb. 5, 2001, pp. 78-79.

* cited by examiner

*Primary Examiner*—Timothy P. Callahan
*Assistant Examiner*—Cassandra Cox
(74) *Attorney, Agent, or Firm*—Reed Smith LLP; Stanley P. Fisher, Esq.; Juan Carlos A. Marquez, Esq.

(57) ABSTRACT

Disclosed herewith is a semiconductor integrated circuit provided with a differential input circuit that can transmit data signals fast to an internal circuit free from distortion of their waveforms without increasing the subject chip in size. The differential input circuit is provided with a pair of first differential input transistors used to amplify mainly the low frequency components of those input signals and having gate terminals connected to a pair of input terminals that receive inputs of differential signals respectively, as well as a pair of second differential input transistors used mainly to amplify high frequency components of those input signals and having control terminals connected to a pair of input terminals that receive inputs of differential signals respectively through capacitance elements. The pairs of first and second differential transistors are connected to each other through a differential connection point (common source).

21 Claims, 18 Drawing Sheets

SEMICONDUCTOR INTEGRATED CIRCUIT DEVICE AND SEMICONDUCTOR INTEGRATED CIRCUIT

PRIORITY CLAIM

This application claims priority under 35 USC §119 to Japanese patent application P2003-001825 filed Jan. 8, 2003, the entire disclosure of which is hereby incorporated herein by reference.

FIELD OF THE INVENTION

The present invention relates to a technique applicable effectively to differential input circuits in semiconductor integrated circuits and further to a method for reducing the attenuation of the signal jitter, more particularly to a technique applicable effectively to input buffer circuits of gate buffers.

BACKGROUND OF THE INVENTION

If data is to be transferred between semiconductor integrated circuits mounted respectively on a printed-circuit board (hereinafter, to be referred to simply as a board) or on different boards, the data signal is often reduced in amplitude and/or shifted in phase due to the attenuation of the signal caused by the parasitic resistance of the package terminal, the line, the cable, etc. on the board, as well as the reflection of the signal from the input/output terminal. And, it is well known that this results in distortion of signal waveforms. In addition, in recent years, a skin effect has often come to appear in high frequency signals as the data transfer rate is improved more and more. The skin effect means a phenomenon that increases the resistance against high frequency signals, since such signals pass near the surface of the subject transmission line. As a result, the distortion of signal waveforms becomes more significant. This has been a conventional problem in data transfer operations.

In such data transfer operations, various types of data are transferred between semiconductor integrated circuits and between boards. For example, there is such data as "0101010101010101. . . " that includes many high frequency components and such data as "000000111111000000111111. . . " that includes many comparatively low frequency components. If data includes many low frequency components, signals that pass a transmission path has less skin effect, so that the amplitude becomes large. On the other hand, if data includes many high frequency components, signals that pass a transmission path comes to be affected by such a skin effect significantly, so that the amplitude becomes small. And, such an amplitude change becomes more significant proportionally to the increase of the transmission line in length.

This is why the output amplitude comes to differ among frequency components included in transmission signals in an input circuit consisting of conventional general differential amplifiers, thereby the amplitude is varied significantly. In addition, when the amplitude of an input signal is small, the time required until a predetermined logic threshold is reached at a logic level change is short, thereby the signal delay is suppressed. On the other hand, when the amplitude of an input signal is large, the signal is delayed more, thereby the signal jitter occurs due to the variation of the frequency components included in the signal.

As a result, the output signal of the input circuit comes to be distorted in waveform as shown in FIG. 24 and the opening of the eye-pattern is narrowed. And, if the opening is excessively narrowed, the input circuit will fail in distinguishing of data, thereby accurate data transfer is disabled. This has been another conventional problem.

One of the methods for solving such conventional problems is proposed (for example, in the non-patent document 1, 2001 IEEE International Solid-State Circuits Conference DIGEST OF TECHNICAL PAPERS p78–79) as a technique for reducing the distortion of signals with use of inductors L1 and L2 provided at the drain sides of the differential input transistors Q1 and Q2 in a differential input circuit. In addition, there is also an input circuit proposed (for example, in the non-patent document 2, 2002 Symposium On VLSI Circuits Conference Digest of Technical Papers p64–p67) to solve such conventional problems. The input circuit, as shown in FIG. 26, is provided with variable gain amplifiers AMP1 and AMP2 for amplifying the low frequency components of input signals IN and /IN, as well as variable gain amplifiers AMP3 and AMP4 for amplifying the high frequency components of input signals. Low and high frequency components are amplified separately in those amplifiers, then signals are combined through a resistor. After that, the signals are amplified in the amplifiers AMPS and AMP6, then inputted to a differential comparator CPM so as to be distinguished from each other (refer to the non-patent document 2, for example).

[Non-patent Document 1]
2001 IEEE International Solid-State Circuits Conference DIGEST OF TECHNICAL PAPERS p78–79

[Non-patent document 2]
2002 Symposium On VLSI Circuits Conference Digest of Technical Papers p64–p67

SUMMARY OF THE INVENTION

In a differential input circuit provided with inductors L1 and L2 at the drain sides of differential input transistors Q1 and Q2 as shown in FIG. 25, if the distortion of a data signal to be transferred at such a rate of 1 Gbps is to be suppressed under a predetermined level, a few nanohenries (nH) will be required as an inductance of each of the inductors L1 and L2. This is found in a trial calculation by the inventor et al of the present invention.

If such an inductance is to be obtained with a spiriferous line pattern formed at a width of 9 μm, at line pitches of 3 μm, and at a winding number of "2", the diameter will become about 200 μm. The area size is found to become equal to the area for 5 input/output buffers. Therefore, if a differential input circuit as shown in FIG. 25 is used for a gate array having 100 to 1000 input pins, the area occupied by the inductors will become very large.

If there is another line under the inductor line and/or the parasitic capacity increases due to the thin insulator against the substrate, the inductance value will decrease. To prevent that problem, therefore, the inductor line should be formed in the top conductive layer. In that connection, existence of any other lines and elements is not allowed. Consequently, in the differential input circuit as shown in FIG. 25, it is difficult to form the inductors L1 and L2 in an empty space to reduce the chip size. It is thus impossible to avoid a significant increase of the chip size. This is still another conventional problem.

Furthermore, in addition to the differential comparator CMP, six more amplifiers are needed even in an input circuit provided with variable gain amplifiers AMP1 and AMP2 for amplifying the low frequency components of the input signals IN and /IN and variable gain amplifiers AMP3 and AMP4 for amplifying high frequency components of those input signals. And, because the number of elements in the input circuit increases such way, the chip comes to be expanded in size unavoidably. This has also been still another conventional problem.

While a description has been made for transferring of data, such frequency characteristics also become a problem when in transferring of clock pulses between semiconductor integrated circuits. Generally, when a system is decided, the clock pulse frequency is also decided so, no signal jitter usually occurs due to any changes of the clock signal in amplitude and delay time to be done in accordance with the frequency. However, if a system is changed to another, both clock frequency and clock transmission line length come to be changed in some cases. And, in that connection, the clock duty goes outside of the allowable range and the margin drops, thereby wrong data might be latched in a circuit that latches data signals synchronously with the received clock.

Under such circumstances, the present invention may provide a semiconductor integrated circuit device provided with an input circuit capable of latching and transferring data signals fast to an internal circuit free from distortion of their waveforms while the chip size is suppressed from expanding.

The present invention may also provide a semiconductor integrated circuit device provided with an input circuit capable of transferring data to an internal circuit accurately while suppressing input data signals from varying in amplitude and increasing in jitter occurrence to be caused by the dependency on the array of transmitted data.

The present invention may also provide a semiconductor integrated circuit device provided with an input circuit capable of preventing the clock signal from duty variation and a circuit that latches data signals synchronously with the clock from margin drop and latching of wrong data.

The above and further novel features of the present invention will more fully appear as described and enabled from the following description when the same is read in conjunction with the accompanying drawings.

According to one aspect of the present invention, in addition to a pair of first differential input transistors used mainly to amplify the low frequency components of input differential signals, each of the transistors having a control terminal connected to one of a pair of input terminals to which differential signals are inputted, the differential input circuit described above also includes a pair of second differential input transistors used mainly to amplify the high frequency components of input differential signals, each of the transistors having a control terminal connected to one of the pair of input terminals to which differential signals are inputted through a capacitance element and a differential connection point (common source) connected to that of its corresponding first differential input transistor.

The pair of the first differential input transistors described above may be any of bipolar transistors and field-effect transistors if it has a control terminal connected directly to one of the pair of input terminals and capable of receiving a current from the input terminal. However, the second differential input transistors described above must be field-effect transistors, since each of them has a control terminal connected to one of the pair of input terminals through a capacitance element and cannot receive a base current from the input terminal. This is why bipolar transistors cannot be used as the second differential input transistors. If the second differential input transistors are field-effect transistors, the first differential input transistors, each having a differential connection point (as a common source) connected commonly to that of the corresponding second differential input transistor should preferably be field-effect transistors.

According to the method described above, both of low and high frequency components of input signals are amplified, so that input data signals are prevented from amplitude variation and signal jitter increasing that occur due to the dependency on the array of transmitted data even when the data signals are transferred faster. Data can thus be transferred accurately to the subject internal circuit. And, while a capacitor to be connected to an input terminal and a pair of second differential input transistors for amplifying the high frequency components of input signals are required for the input circuit, the capacitor can be formed in an area smaller than that of an inductor in the semiconductor integrated circuit, so that the chip is not expanded so much in size to latch and transfer fast data signals to the internal circuit free from distortion of their waveforms.

Furthermore, because the input circuit that latches a clock pulse signal inputted from external to supply it to an internal circuit can amplify both low and high frequency components of the input signal, the signal is prevented from amplitude reduction even when the clock frequency rises. The clock signal can thus be prevented from duty distortion, thereby the circuit that latches data signals synchronously with the clock can be prevented from margin drop and wrong data latching.

According to the second aspect of the present invention, in addition to a pair of first differential input transistors used mainly to amplify the low frequency components of input differential signals, each of the transistors having a control terminal connected to one of a pair of input terminals to which differential signals are inputted, the differential input circuit described above also includes a pair of second differential input transistors used mainly to amplify the high frequency components of input differential signals, each of the transistors having a control terminal connected to one of a pair of input terminals to which differential signals are inputted through a capacitance element and a differential connection point (common source) connected to that of its corresponding first differential input transistor. And, the input circuit uses a coupling capacitance between a first line and a tube-like second line formed to enclose the first line as each of the above capacitance elements. This has made it possible to form a capacitance element that transmits high frequency components of input differential signals to the object without providing the input circuit with any dedicated area.

DETAILED DESCRIPTION OF THE PREFERRED EMBODIMENTS

Hereunder, the preferred embodiments of the present invention will be described with reference to the accompanying drawings.

Figure 1:
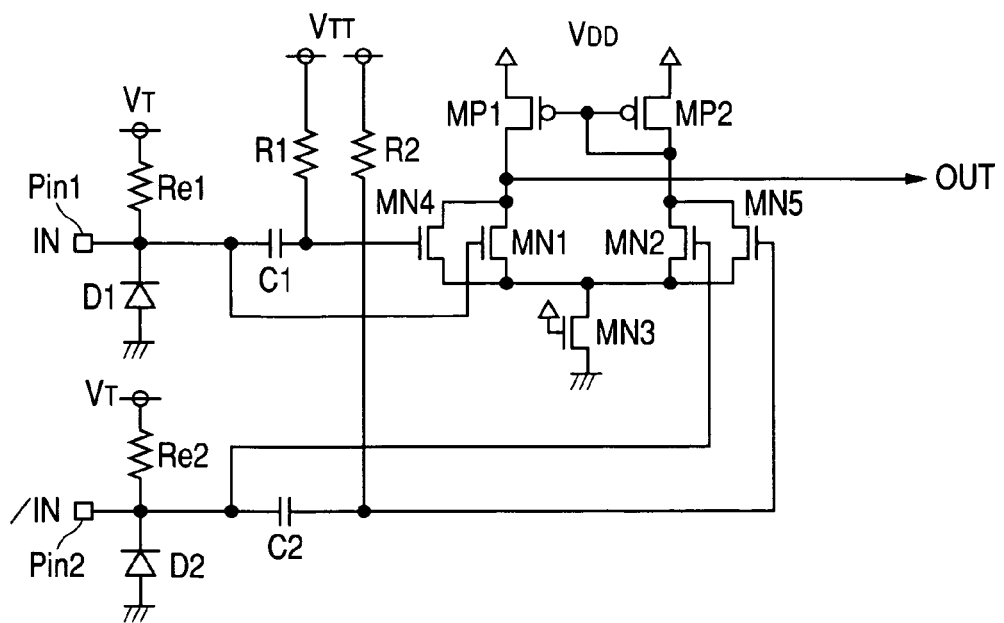
FIG. 1 is a circuit diagram of a differential input circuit in the first embodiment of the present invention.

FIG. 1 shows a differential input circuit (hereinafter, to be referred to just as the input circuit) in the first embodiment of the present invention.

In FIG. 1, Pin 1 and Pin 2 denote input terminals to which differential input signals IN and /IN are inputted from external. In a semiconductor integrated circuit, these input terminals are generally formed as electrodes referred to as bonding pads connected to one end of bonding wire respectively or pads connected to the package side electrodes through a solder ball or the like respectively.

The input circuit in this first embodiment is configured by a pair of N-channel differential input MOSFETs MN1 and MN2, each having a source terminal connected to that of the other to form a common source and a gate terminal connected to one of the pair of input terminals Pin1 and Pin2; a pair of N-channel differential input MOSFETs MN4 and MN5, each having a source terminal connected to that of its corresponding N-channel differential input MOSFET MN1/MN2 and a gate terminal connected to its corresponding input terminal Pin1/Pin2 through a capacitor C1/C2; a constant current MOSFET MN3 connected between the common source terminal of MOSFETs MN1 and MN2 and a ground point (VSS); a pair of P-channel MOSFETs MP1 and MP2 connected between the drain terminal of each of the N-channel differential input MOSFETs MN1 and MN2 and a supply voltage terminal VDD; resistors R1 and R2 connected between the gate terminal of each of the N-channel differential input MOSFETs MN4 and MN5 and a constant voltage terminal VTT; electrostatic discharge protection diodes D1 and D2, each being connected between each of the input terminals Pin1 and Pin2 and a ground point; and a pair of terminal resistance elements Re1 and Re2, each being connected to between one of the input terminals Pin1 and Pin2 and a constant voltage terminal VT. Although not shown in FIG. 1, in addition to D1 and D2, another protection diode may be connected between one of the input terminals Pin1 and Pin2 and the power source VDD.

The gate and the drain are connected to each other in the load MOSFET MP2 while the gate of the load MOSFET MP1 is connected to that of the MP2 to form a current mirror. The constant voltage terminal VTT for supplying a bias potential, that is, the amplitude center potential to the gates of the differential input MOSFETs MN4 and MN5 may be a voltage between the threshold voltage Vth of the MOSFET MN4 and the supply voltage VDD. The VT denotes a terminal potential. Although not limited specially in this embodiment, the VDD is set at 1.5V and the VTT is set at 1.0V.

Each of the terminal resistance elements Re1 and Re2 is set at such a resistance as 50Ω in accordance with the transmission line impedance (50Ω) expected in this embodiment. Consequently, fast signals inputted through a terminal are prevented from waveform disturbance to be caused by internal signal reflection or the like. Although not shown in FIG. 1, the terminating resistance elements Re1 and Re2 may be connected to the input terminals Pin1 and Pin2 so as not to be provided in the chip.

In this embodiment, each of the capacitors C1 and C2 has a capacity of, for example, 0.25 pF on the assumption that the transfer rate of the input data signals IN and /IN becomes 1 Gbps. And, each of the resistors R1 and R2 has a resistance of 1 kΩ. Consequently, the time constant is set at about 200 ps. While signals of a few hundreds of MHz to a few hundreds of GHz are inputted to the input terminals Pin1 and Pin2, therefore, the high frequency components can be supplied to the gate terminals of the MOSFET MN4 and MN5 through the capacitors C1 and C2 so as to be amplified there. Because there is no capacitor disposed between each of the input terminals Pin1 and Pin2 and each of the gate terminals of the MOSFET MN1 and MN2, the MOSFETs MN1 and MN2 can be dedicated to amplify the low frequency components of input signals.

When a signal having a frequency between a few hundreds of MHz and a few hundreds of GHz is inputted to the input terminals Pin1 and Pin2, therefore, MOSFETs MN1 and MN2, as well as MN4 and MN5 can be used to amplify low and high frequency components of input signals. And, while a signal having a frequency under a few hundreds of MHz is inputted to the input terminals Pin1 and Pin2, the signal is inputted only to the MOSFETs MN1 and MN2, so that the low frequency components of the signal are amplified, then the signal is supplied to the object internal circuit.

If it is expected that the transfer rate of the input data signals IN and /IN is 3 Gbps (about 300 ps), the time constant is smaller than the cycle of the data transfer rate and a resistor having such a resistance value as 1 kΩ is used, the capacitor C may be designed so as to have such a capacity value as 0.16 pF.

Figure 12A:
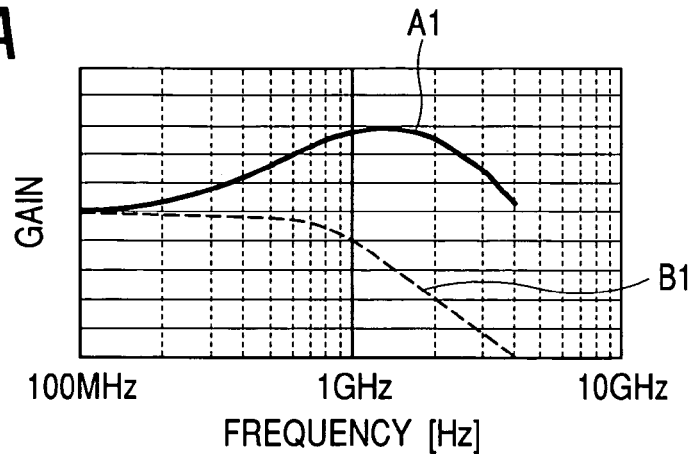
FIGS. 12A, 12B and 12C are graphs for describing simulation results of both gain and delay characteristics of the differential input circuit in the fourth embodiment of the present invention and in a conventional differential input circuit.
Figure 12B:
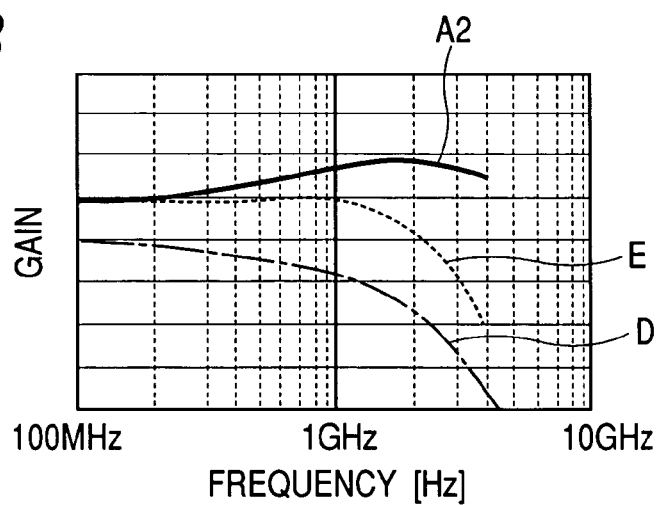
Figure 12C:
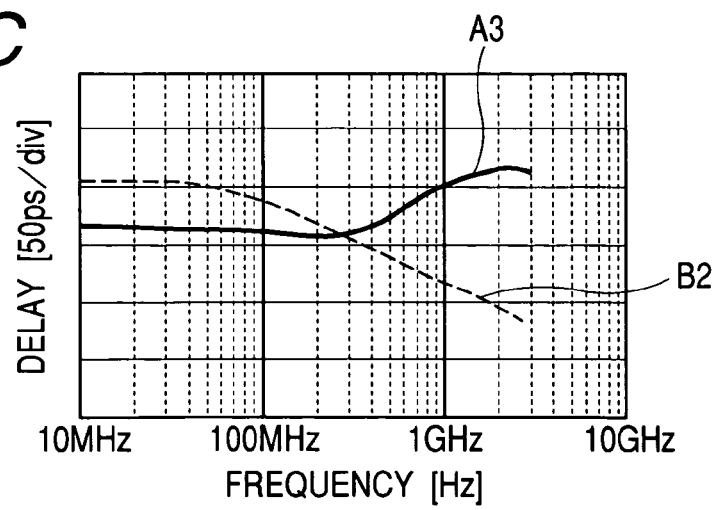

FIGS. 12A to 12C show graphs for denoting simulation results of both gain and delay characteristics of a conventional differential input circuit in which none of the differential input MOSFETs MN4 and MN5 and the capacitors C1 and C2 is provided. FIGS. 12A and 12B show the simulation results of the gain characteristics while FIG. 12C shows those of the delay characteristics. In FIGS. 12A through 12C, solid lines A1 to A3 denote the characteristics of the input circuit in this embodiment and short dashes lines B1 and B2 denote the characteristics of the conventional differential input circuit. The alternate long and short dash line D denotes the loss characteristics of the transmission line and the dotted line denotes the combined characteristics of both gain characteristics A2 and the loss characteristics D.

As shown in FIG. 12A, in the conventional differential input circuit not provided with any of the differential input MOSFETs MN4 and MN5 and the capacitors C1 and C2, the gain of each signal having a frequency over 300 MHz decreases step by step according to an increase of the frequency. In the input circuit in this embodiment, however, it is proved that the gain of each signal having a frequency over one hundred of MHz to 4 GHz is higher than that of any other signal having another frequency. And, as shown in FIG. 12B, it will be found that the input circuit in this embodiment enables a high gain to be obtained with respect to each signal over one hundred of MHz to 4 GHz even when the signal amplitude is reduced due to the loss by the transmission line. Consequently, the input circuit can compensate the loss by the transmission line as denoted by the dotted line E and assure that signals having frequencies up to 1 GHz are supplied to the internal circuit almost free from amplitude reduction.

Furthermore, as shown in FIG. 12C, in the conventional differential input circuit not provided with any of the differential input MOSFETs MN4 and MN5, as well as any of the capacitors C1 and C2, if the frequency of an input signal goes over 100 MHz, the signal delay begins to decrease. In the input circuit in this embodiment, however, the signal delay would increase until the frequency reaches a few gigahertz. This is because it takes a longer time until the logic threshold value of the circuit is reached from the maximum or minimum level due to such an increase of the signal amplitude.

Figure 13A:
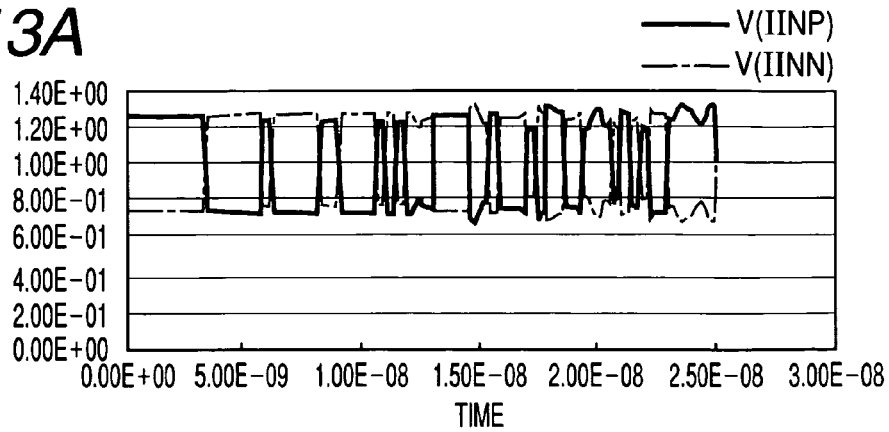
FIGS. 13A, 13B, 13C, and 13D are charts for describing the waveforms of an input/output signal to/from the input circuit in an embodiment of the present invention when a 1 Gbps data signal is transmitted through a transmission line.
Figure 13B:
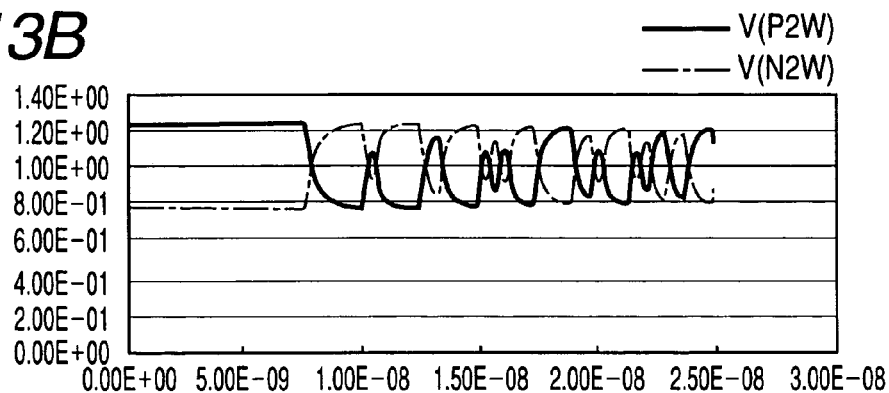
Figure 13C:
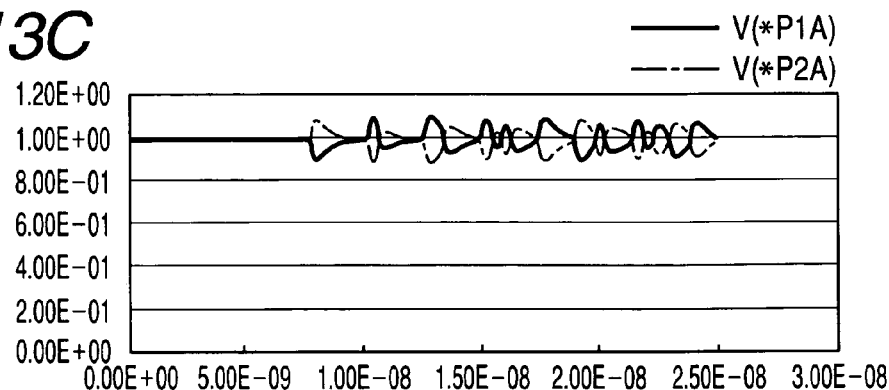
Figure 13D:
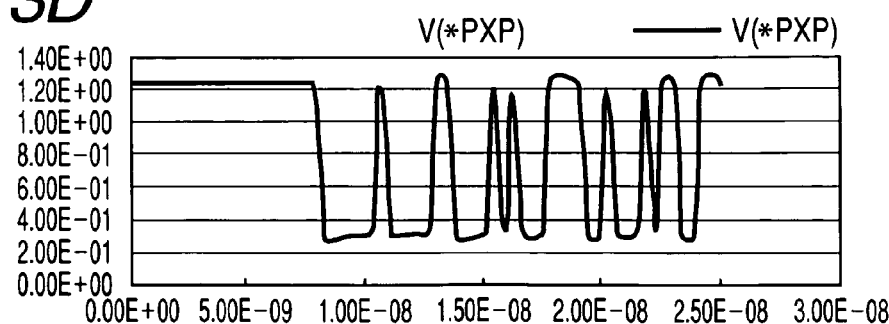

FIG. 13A through FIG. 13D show simulation results of the input/output signal waveforms when 1 Gbps data signals are transmitted to the input circuit in this embodiment through a transmission line. FIG. 13A shows the waveform of an output signal from an output circuit, that is, the waveform of a signal at the starting point of the transmission line while FIG. 13B shows the waveform of an input signal to the gate terminals of the differential input MOSFET MN1 and MN2. FIG. 13C shows the waveform of an input signal to the differential inputs MOSFET MN4 and MN5 through the capacitors C1 and C2 while FIG. 13D shows the waveform of the output signal from the input circuit in this embodiment.

As shown in FIG. 13D, the output signal from the input circuit in this embodiment can have an amplitude enough whether the frequency is high or low. On the other hand, the output signal from the conventional differential input circuit that is not provided with any of the differential input MOSFETs MN4 and MN5, as well as any of the capacitors C1 and C2 is a signal obtained just by amplifying the input signal, so that the waveform itself is similar between both input and output signals. Therefore, when the input signal frequency is low, the signal amplitude is enough. When the input signal frequency is high, however, the signal amplitude is insufficient.

Figure 2:
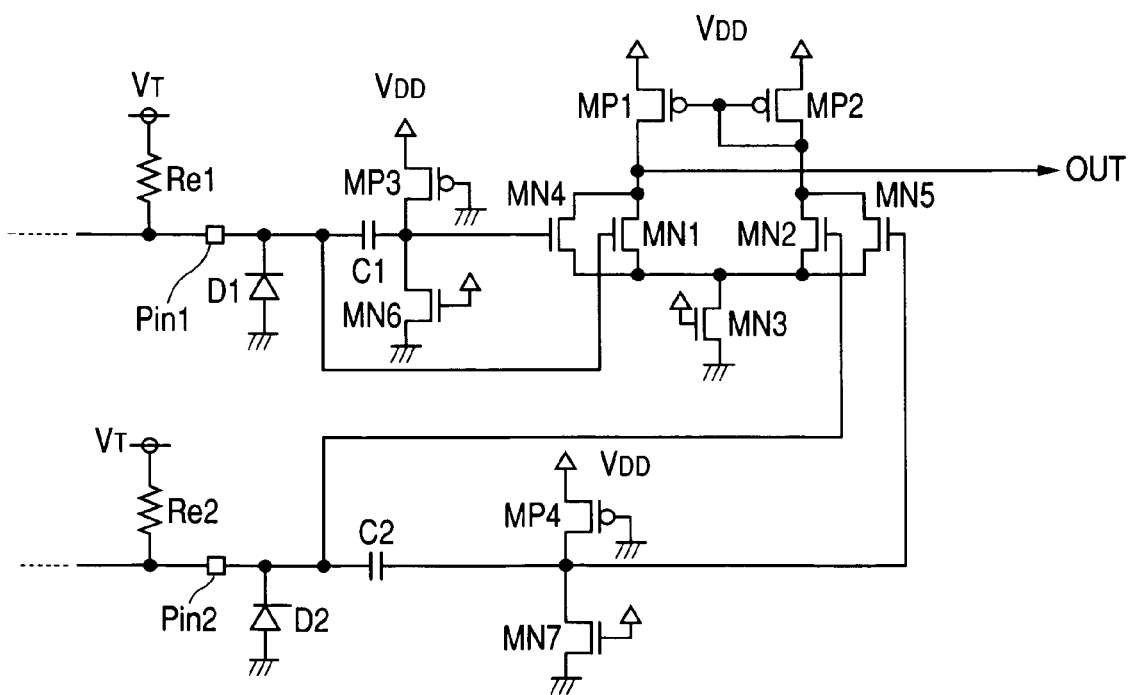
FIG. 2 is a circuit diagram of a differential input circuit in the first variation of the first embodiment of the present invention.

FIG. 2 shows the first variation of the input circuit in the first embodiment shown in FIG. 1.

The input circuit shown in FIG. 2 is modified from that shown in FIG. 1 so that the resistors R1 and R2 for giving a bias potential to the gates of the differential input MOSFETs MN4 and MN5 respectively are replaced with P-channel MOSFET MP3 and MP4, each connected between one of MN4 and MN5 and the supply voltage VDD, as well as N-channel MOSFETs MN6 and MN7, each connected between one of MN4 and MN5 and the ground point while the ground potential VSS is applied to the gate terminals of the MP3 and the MP4 and the supply voltage VDD is applied to the gate terminals of the MN6 and MN7 to give a bias potential to the gate of each of the different input MOSFETs MN4 and MN5 according to the ratio between the on-resistance of MP3 and that of MN6, as well as the ratio between the on-resistance of MP4 and that of MP7. The circuit in this first variation is thus specially effective when the terminal resistance elements Re1 and Re2 are provided out of the chip.

This is because a bias potential to be given to the gates of the differential input MOSFETs MN4 and MN5 can be generated according to the resistance ratio between the MOSFETs, thereby the source of the constant voltage VTT can be omitted. And, when the constant voltage VTT is supplied from external, the external terminal can be omitted. When the constant voltage VTT is generated inside the chip, the constant voltage circuit can be omitted. The chip size can thus be suppressed from increasing accordingly.

Figure 3:
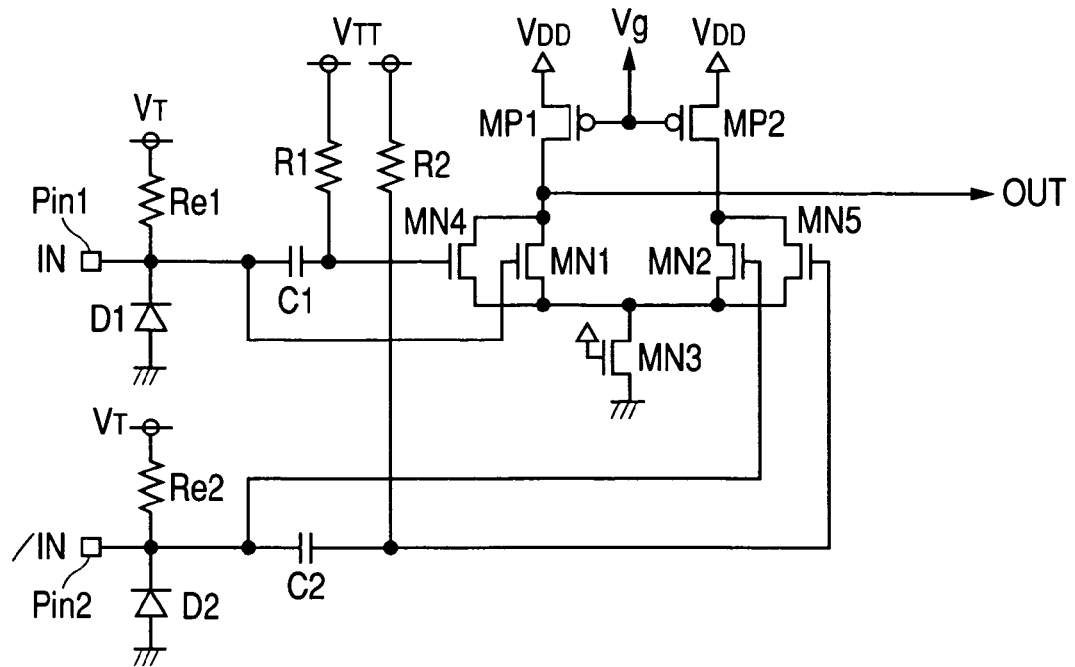
FIG. 3 is a circuit diagram of a differential input circuit in the second variation of the first embodiment of the present invention.

FIG. 3 shows the second variation of the input circuit in the first embodiment shown in FIG. 1.

The input circuit shown in FIG. 3 is modified from that shown in FIG. 1 so that the voltage supplied to the gates of the load MOSFETs MP1 and MP2 from the diode-connected current mirror MOSFET MP2 is replaced with an optimal bias voltage Vg generated from a constant voltage circuit (not shown). In the input circuit in this second variation, while the input circuit in this variation must be provided such a constant voltage circuit, the center potential of the signal supplied from the input circuit to the object internal circuit can be set independently of the constant and characteristics of each of the elements (MN1 to MN5, MP1, and MP2). This is an advantage of this input circuit. It is also possible to supply the bias voltage Vg from external. In that connection, however, the chip must also be provided with an external terminal additionally.

Even in this second variation, the resistors R1 and R2 for giving a bias potential to the gates of the differential input MOSFETs MN4 and MN5 can be replaced with P-channel MOSFET MP3 and MP4, each being connected between one of the MN4 and MN5 and the supply voltage VDD, as well as N-channel MOSFETs MN6 and MN7, each being connected between one of the MN4 and MN5 and the ground point while the bias potential is applied to the gate terminals of the MN4 and the MN5 according to the resistance ratio between MP3 and MN6, as well as the resistance ratio between MP4 and MN7. The terminating resistance elements Re1 and Re2 may be provided out of the chip.

Figure 4:
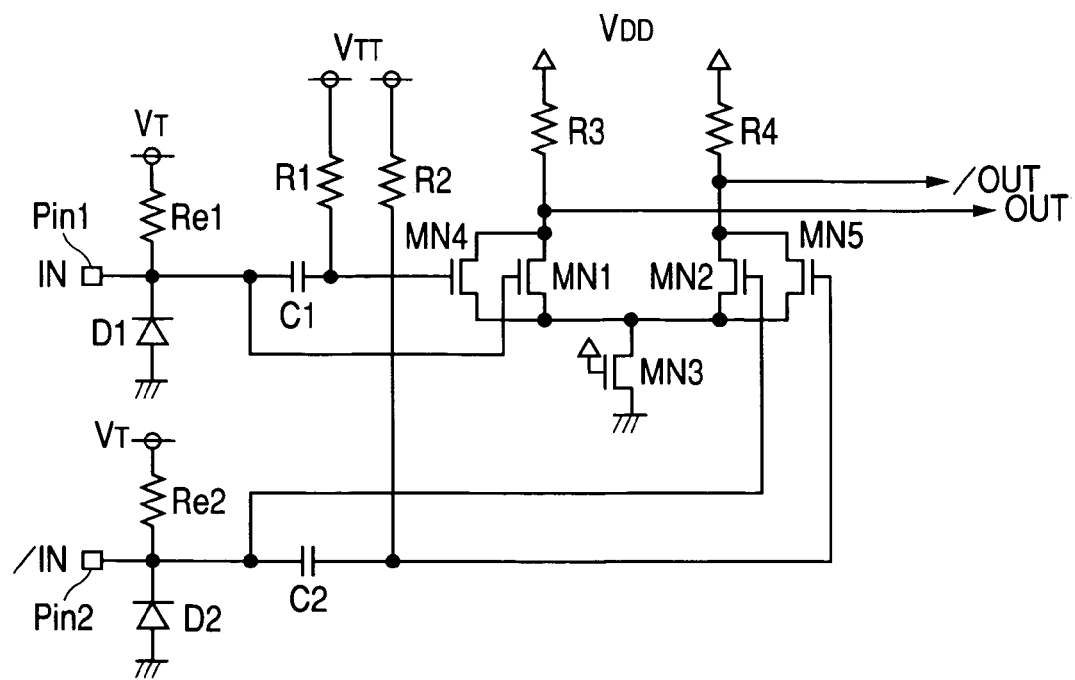
FIG. 4 is a circuit diagram of a differential input circuit in the third variation of the first embodiment of the present invention.

FIG. 4 shows the third variation of the input circuit in the first embodiment shown in FIG. 1.

The input circuit shown in FIG. 4 is modified from that shown in FIG. 1 so that the load MOSFETs MP1 and MP2 are replaced with load MOSFETs R3 and R4. The resistors R3 and R4 may be formed, for example, in the same polysilicon layer as that of the gate electrode of a MOSFET or in a diffusion layer formed on the semiconductor chip. The input circuit in this variation has an advantage that the center potential of the signal supplied to the internal circuit from the input circuit can be decided by the resistance value of the resistors R3 and R4 independently of the constants and characteristics of the elements (MN1 to MN5, MP1 and MP2).

Even in this variation, the resistors R1 and R2 may be replaced with P-channel MOSFET MP3 and MP4, each being connected between one of the MN4 and MN5 and the supply voltage VDD, as well as N-channel MOSFETs MN6 and MN7, each being connected between one of the MN4 and MN5 and the ground point while the gate bias potential is applied to the gate terminals of the MN4 and the MN5 according to the resistance ratio between MP3 and MN6, as well as the resistance ratio between MP4 and MN7. The terminal resistance elements Re1 and Re2 may be provided out of the chip.

Figure 6:
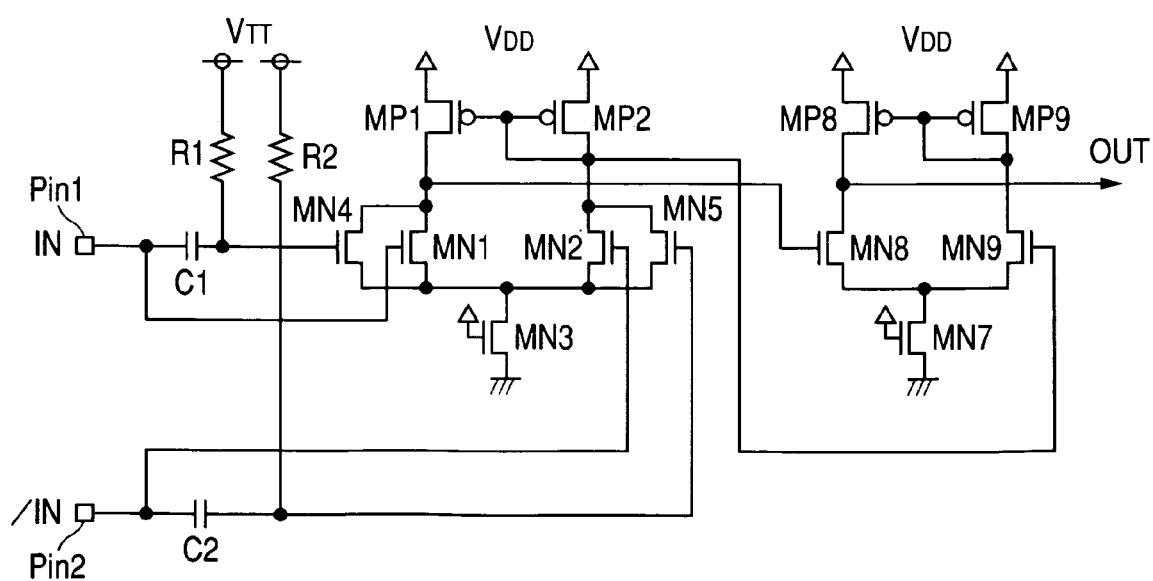
FIG. 6 is a circuit diagram of a differential input circuit in the fifth variation of the first embodiment of the present invention.

FIG. 6 shows the fifth variation of the input circuit in the first embodiment shown in FIG. 1.

Figure 5:
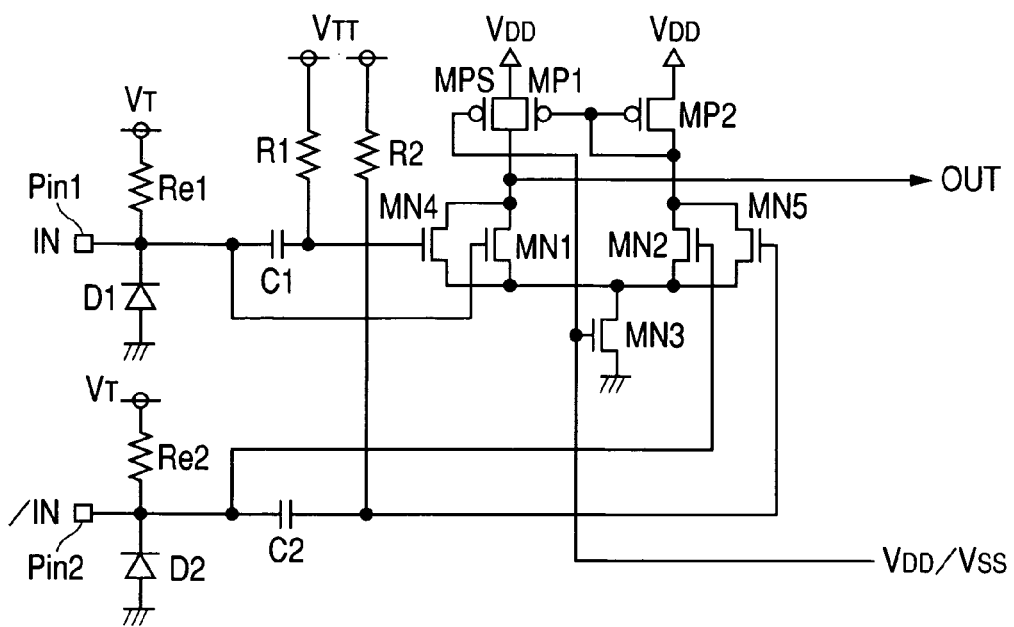
FIG. 5 is a circuit diagram of a differential input circuit in the fourth variation of the first embodiment of the present invention.

The input circuit shown in FIG. 5 is modified from that shown in FIG. 1 so that a switch MOSFET MPS is disposed in parallel to the load MOSFET MP1 in the input circuit shown in FIG. 1 so as to input the same signals as those of the gate terminal of the current generator MN3. In the normal operation state, the supply voltage VDD is supplied to both of the switch MOSFET MPS and the current generator MN3 to turn off the switch MOSFET MPS and turn on the MN3 to supply a current to the input circuit so as to activate the input circuit. In such a state as the standby, the supply voltage VDD is switched to the ground potential to turn off the current generator MN3 to stop the current supply so as to deactivate the input circuit. At this time, the switch MOSFET MPS is turned on and the potential of the output node is fixed at High so as to shut off a through-current that might otherwise flow in the CMOS circuit.

Although not shown in FIG. 5, it is also possible to provide another variation in which the switch MOSFET MPS is disposed in parallel to the load MOSFETs MP1 and MN1 as shown in FIG. 5 in the input circuit shown in each of FIGS. 2 and 3. In the variation shown in FIG. 4, the switch MOSFET MPS shown in FIG. 5 is not required to control the on/off state of the input circuit; it is just required to configure the input circuit so as to switch the gate voltage of the current generator MN3.

FIG. 6 is the fifth variation of the input circuit in the first embodiment shown in FIG. 1.

The input circuit shown in FIG. 6 is modified from that shown in FIG. 1 so that another differential amplification circuit is provided in the next step of the input circuit shown in FIG. 1, so that the output signal of the input circuit is taken out differentially and inputted to the differential amplification circuit in the next step so as to be amplified again, then transferred to the internal circuit. Even in this variation, the input circuit may be modified in configuration just like each of those shown in FIGS. 2 through 5.

Figure 7:
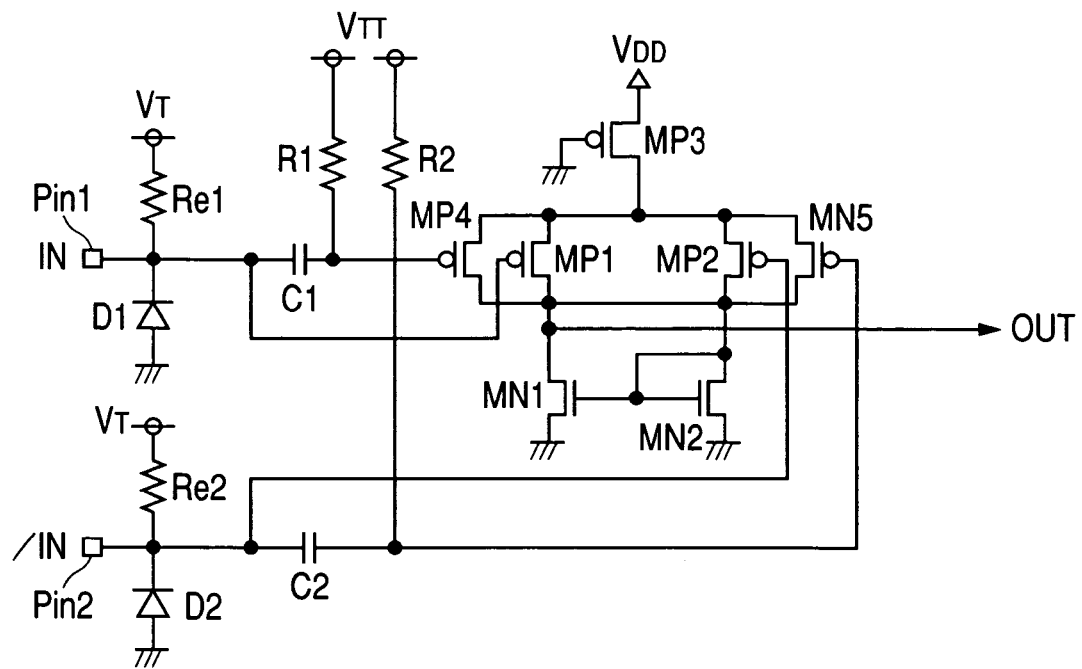
FIG. 7 is a circuit diagram of a differential input circuit in the second embodiment of the present invention.

FIG. 7 shows an input circuit in the second embodiment of the present invention.

The input circuit in this second embodiment is modified from that in the first embodiment so that N-channel MOSFETs are replaced with P-channel MOSFETs MP1 to MP5 used as both differential input and current generators and P-channel load MOSFETs are replaced with N-channel load MOSFETs MN1 and MN2. The input circuit in this second embodiment is characterized in that the center potential to be supplied to the internal circuit can be set lower than that of the input circuit in the first embodiment.

Figure 8:
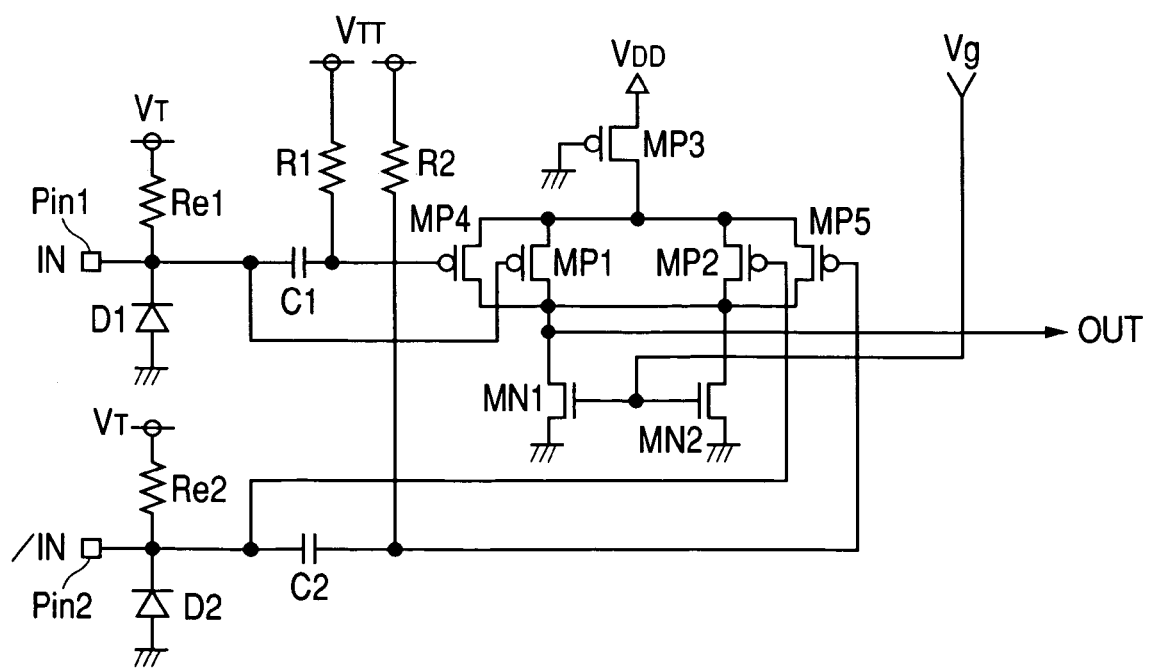
FIG. 8 is a circuit diagram of a differential input circuit in the first variation of the second embodiment of the present invention.
Figure 9:
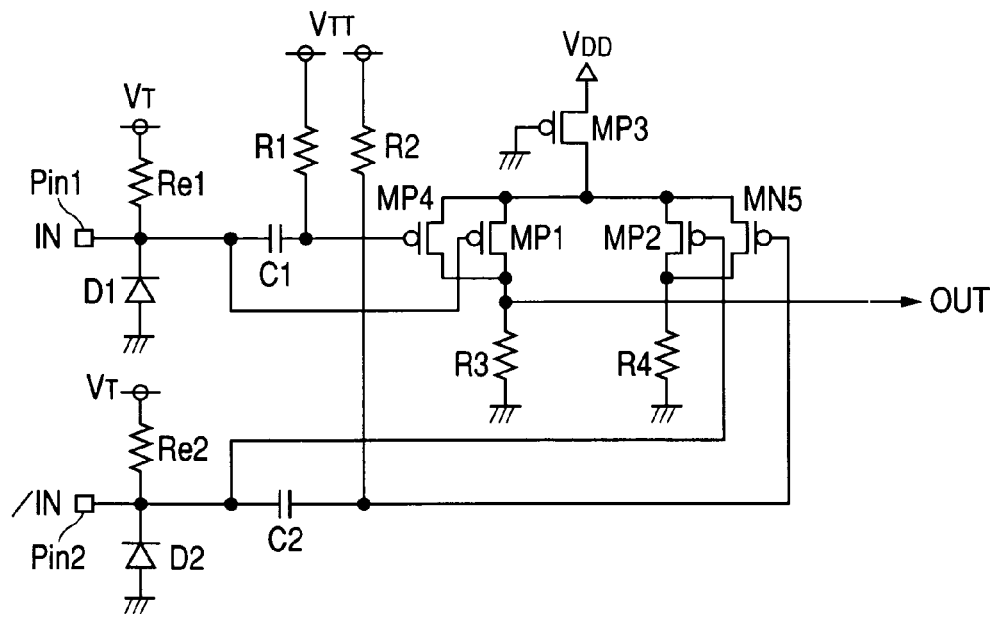
FIG. 9 is a circuit diagram of a differential input circuit in the second variation of the second embodiment of the present invention.

FIG. 8 shows a variation of the input circuit in this second embodiment. The variation is equivalent to that of the first embodiment, shown in FIG. 3. FIG. 9 shows another variation of the input circuit in this second embodiment. The variation is equivalent to that of the first embodiment, shown in FIG. 4. Although not shown in any drawing, other variations are also possible. For example, the resistors R1 and R2 in the input circuit shown in FIGS. 8 and 9 may be replaced with resistance dividing MOSFETs MP3, MN6, MP4, and MN7 shown in FIG. 2. In FIGS. 8 and 9., it is also possible to provide the input circuit with a switch MOSFET MPS disposed in parallel to the load MOSFETs MP1 and MN1 as shown in FIG. 5.

Figure 10:
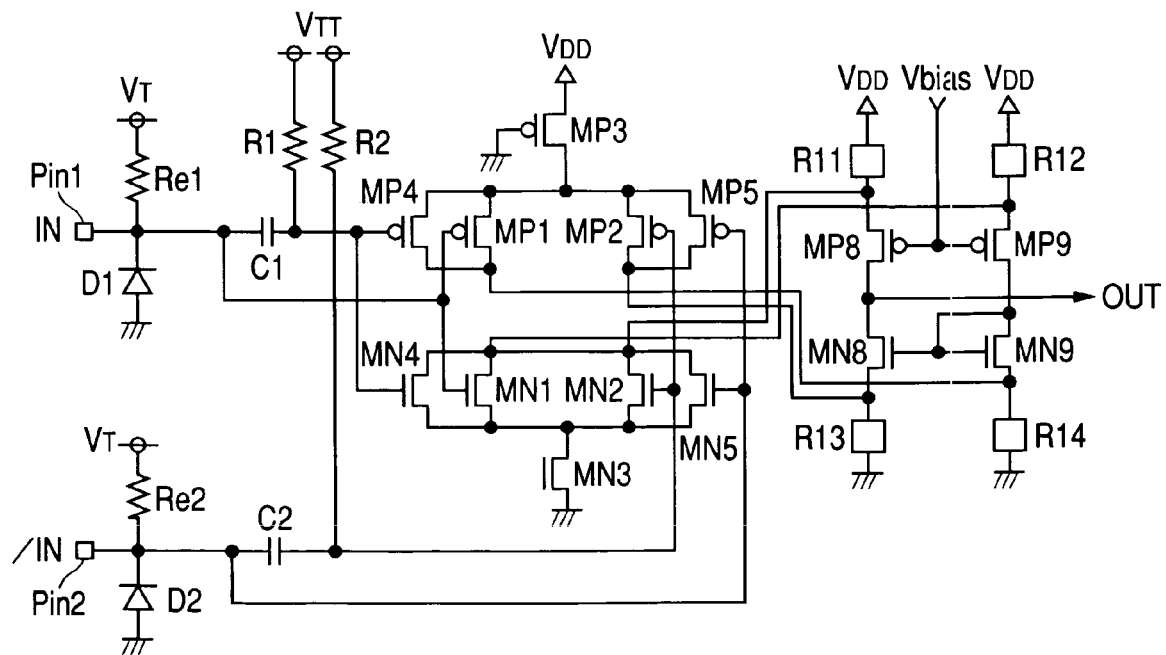
FIG. 10 is a circuit diagram of a differential input circuit in the third embodiment of the present invention.

FIG. 10 shows an input circuit in the third embodiment of the present invention.

The input circuit in this third embodiment is configured so as to receive the differential input signals IN and /IN at the P-channel differential input MOSFETs MP1, MP2, MP4, and MP5, as well as at the N-channel differential input MOSFETs MN1, MN2, MN4, and MN5. The drains of the P-channel and N-channel differential input MOSFETs MP1, MP2, MP4, and MP5 are connected to a ground point through the load elements R13 and R14 respectively while the drains of the N-channel differential input MOSFETs MN1, MN2, MN4, and MN5 are connected to the supply voltage terminal VDD through the load elements R11 and R12 respectively.

MOSFETs MP8 and MN8 used to set the center potential of each output signal are connected to each other serially between the load elements R11 and R13 while MOSFETs MP9 and MN9 used to set the center potential of each output signal are connected to each other serially between the load elements R12 and R14 respectively. And, a predetermined bias voltage Vbias is applied to the gate terminals of the MP8 and the MP9 while the drain voltage of the diode-connected MN9 is applied to the gate terminals of the MN8 and the MN9 so as to take out the output signals from the drain terminal of the MN8.

Some variations are also possible even for the input circuit in this embodiment. For example, the resistors R1 and R2 in the input circuit shown in FIG. 10 may be replaced with the resistance dividing MOSFETs MP3, MN6, MP4, and MN7 shown in FIG. 2 and the terminating resistance elements Re1 and Re2 may be provided as external ones. Furthermore, the load elements R11 to R14, as well as the bias MOSFETs MP8, MP9, MN8, and MN9 may be omitted and the drain terminal of each P-channel differential input MOSFET may be connected to the drain terminal of each N-channel differential input MOSFET directly.

Figure 11:
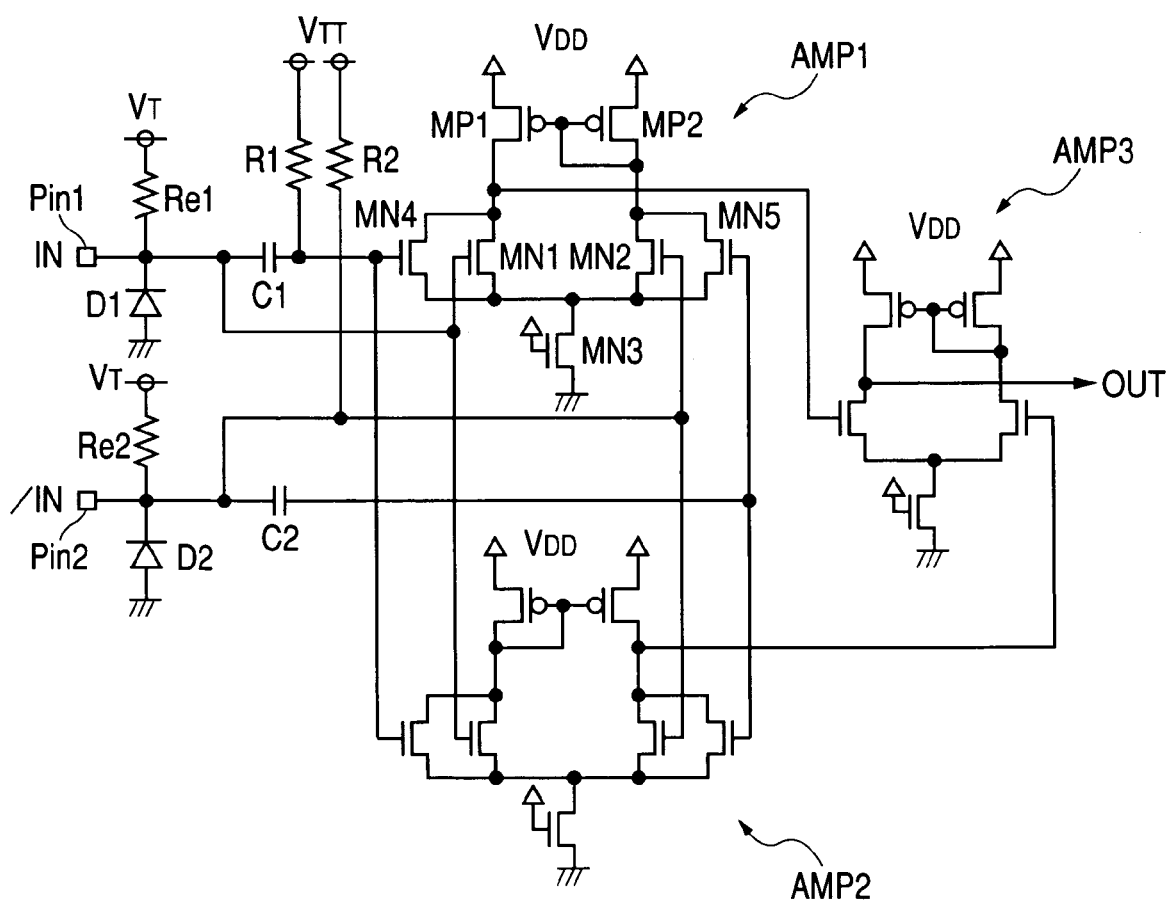
FIG. 11 is a circuit diagram of a differential input circuit in the fourth embodiment of the present invention.

FIG. 11 shows an input circuit in the fourth embodiment of the present invention.

Unlike other embodiments described above, in this fourth embodiment, the input circuit is provided with differential amplifiers AMP1 and AMP2 for receiving the differential input signals IN and /IN separately and another differential amplifier AMP3 that operates in accordance with the output received from those amplifiers AMP1 and AMP2. This embodiment has an advantage that the voltage of the drain terminal of a MOSFET that is a counterpart of the gate-drain connected MOSFET among the load MOSFETs can be used as an output voltage in the differential amplifiers AMP1 and AMP2 located in the previous step, so that the output signal is balanced well and the dynamic range is widened more.

Some variations are also possible for the input circuit in this embodiment. For example, the resistors R1 and R2 in the input circuit shown in FIG. 11 may be replaced with resistance dividing MOSFETs MP3, MN6, MP4, and MN7 shown in FIG. 2, the terminal resistance elements Re1 and Re2 may be provided as external ones, and a switch MOSFET MPS may be disposed in parallel to the load MOSFETs MP1 and MN1 shown in FIG. 5 to control the on/off of the input circuit shown in FIG. 11.

Figure 14:
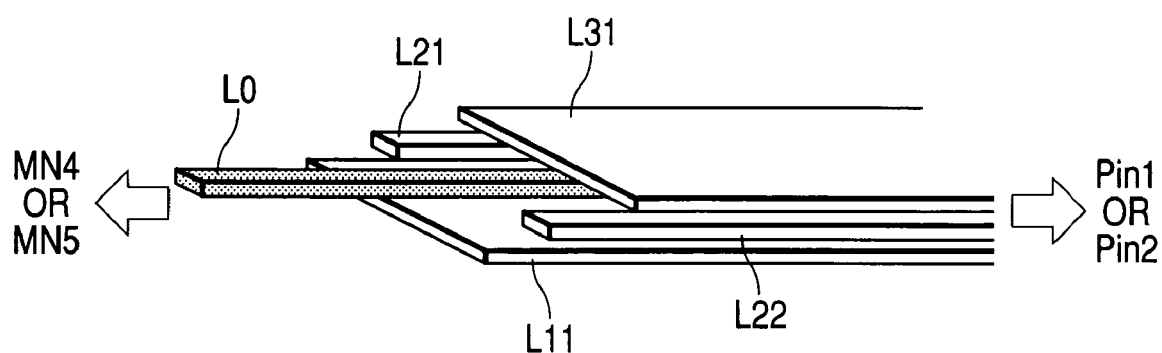
FIG. 14 is a perspective view of a cross section of a concrete configuration of a capacitor for transferring the high frequency components of input signals to a differential MOSFET.
Figure 15:
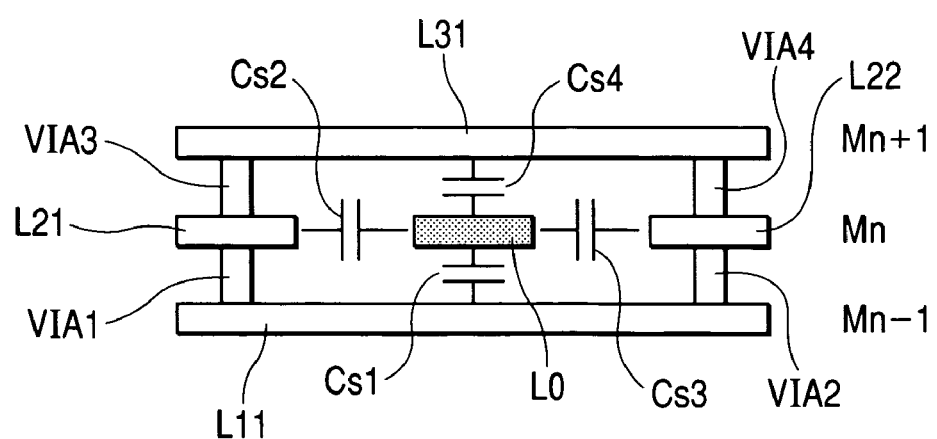
FIG. 15 is a cross sectional view of a structure of the lines of the capacitor shown in FIG. 14.

FIGS. 14 and 15 show concrete illustrations of the capacitor C1/C2 for transmitting the high frequency components of input signals to the corresponding differential input MOSFET MN4/MN5.

In this embodiment, the coupling capacitance elements Cs1 to Cs4 disposed between the lines as shown in FIG. 15 are used to form the capacitors C1 and C2 disposed between the input terminal Pin1/Pin2 and the differential input MOSFET MN3/MN4. More concretely, the coupling capacitance Cs1 to Cs4 that are parasitic to between the line L0 formed in an intermediate metallic layer Mn and each of the lines L11, L21, L22, and L31 formed to enclose the line L0 in the same metallic layer, as well as in both upper and lower metallic layers Mn+1 and Mn-1 of the layer Mn are used as the capacitors C1 and C2 for transmitting the high frequency components of input signals. In other words, those capacitors C1 and C2 are formed as a metal-insulator-metal structure (MIM structure) configured by the upper and lower metallic layers to enclose the line L0. Also in this embodiment, a conductive film formed mainly with Al (aluminum) or Cu (copper) is used to form the metallic lines.

The line L11 is connected electrically to each of the lines L21 and L31, and to each of the lines L22 and L31 through VIA1 to VIA4 referred to as via holes. The via holes are filled in through-holes formed in an insulator respectively. The via holes VIA1 to VIA4 are formed at the minimum intervals decided by the design rule along their corresponding lines. Consequently, the value of the coupling capacitance between the line L0 and each of the lines L11 to L31 can be set larger. The metallic layers Mn-1, Mn, and Mn+1 may be, for example, the first to third layers formed on the main surface of the semiconductor substrate. However, they maybe the second to fourth layers and the line L0 may be formed in two (second and third) metallic layers while the lines L11 and L31 may be formed in the first and fourth metallic layers respectively.

One end of a tube-like line assembly consisting of the lines L11, L21, L22, and L31 is connected to an external input terminal Pin1 or Pin2 formed as a pad while one end (opposite side of the pad) of the core-side line L0 is connected to the gate terminals of the differential input MOSFETs MN4 and MN5. While it is possible to connect the core-side line L0 to a pad and the tube-like line assembly to the gate terminals of the MN4 and MN5 respectively, the core-side line L0 should preferably be connected to the gate terminals of MN4 and MN5, since the tube-like line assembly might cause the parasitic capacity between the line assembly and another outside line or substrate to increase, thereby the time constant is deviated from the design value and the capacitance value varies due to the substrate potential, for example, and furthermore, external noise might be inputted to the gate terminals of MN4 and MN5 easily.

It is also possible not to enclose the line L0 completely by the lines L11, L21, L22, and L31; in other words, the line L0 may be surrounded by them to take a U-letter shape by opening part of the enclosure by the lines. In that connection, because the parasitic capacity between the line L0 and the substrate must be reduced, the line L21 or L22 should be omitted. And, when omitting one of the lines L21 and L22, the line L31 should also be omitted.

Figure 16:
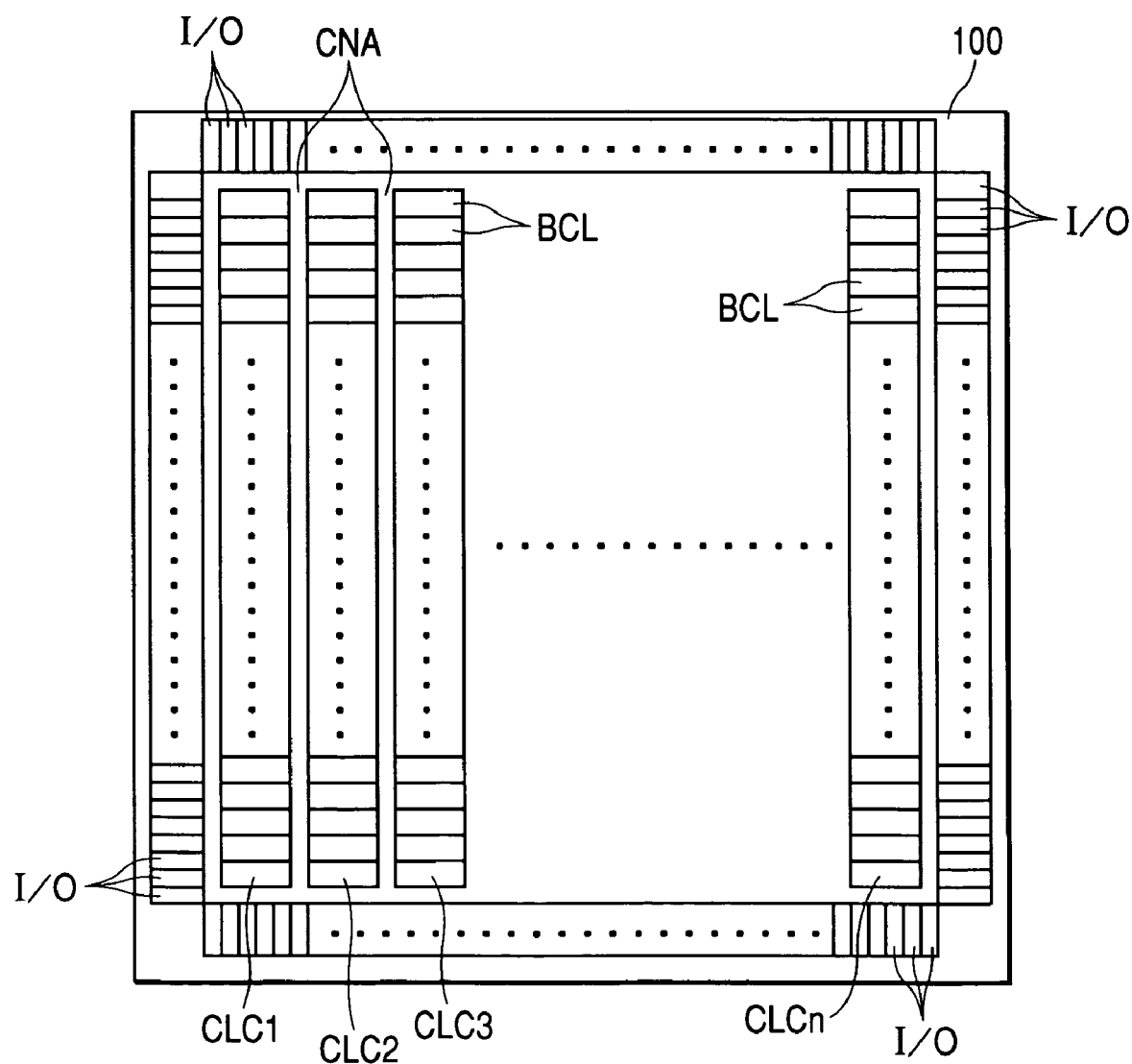
FIG. 16 is a top view of a layout of a differential input circuit in an embodiment of the present invention when it is employed for a gate array.

FIGS. 16 through 22 show a layout of the differential input circuit used for a gate array and examples of the semiconductor integrated circuit device structure. The differential input circuit uses coupling capacitance elements that function between lines as shown in FIG. 14 as the capacitors C1 and C2 for transmitting high frequency components of input signals to the differential input MOSFETs MN4 and MN5. FIG. 16 shows a schematic layout of the whole chip.

In FIG. 16, each reference symbol I/O denotes an input/output circuit while each reference symbol BCL denotes a basic cell used for an internal logic circuit. A basic cell is provided with, for example, a P-channel MOSFET and an N-channel MOSFET that are paired. The basic cell also includes other elements usable for forming one or more CMOS inverters, multi-input CMOS-NOR gate circuits, or multi-input CMOS-NAND gate circuits.

The input/output circuit I/O is designed to be used for any of the differential input circuit and the output buffer as shown in FIG. 1 if the line layout is changed. And, as shown in FIG. 16, a plurality of input/output circuits I/O are disposed at each side of a semiconductor chip 100 and a plurality of cell arrays CLC1 to CLCn are provided in the center of the chip 100 enclosed by those input/output circuits I/O. In each cell array CLC, a plurality of basic cells BCL are disposed side by side. A space CNA between cell arrays CLC1 to CLCn is a line channel region in which the line for connecting a cell to another is laid out.

Figure 17:
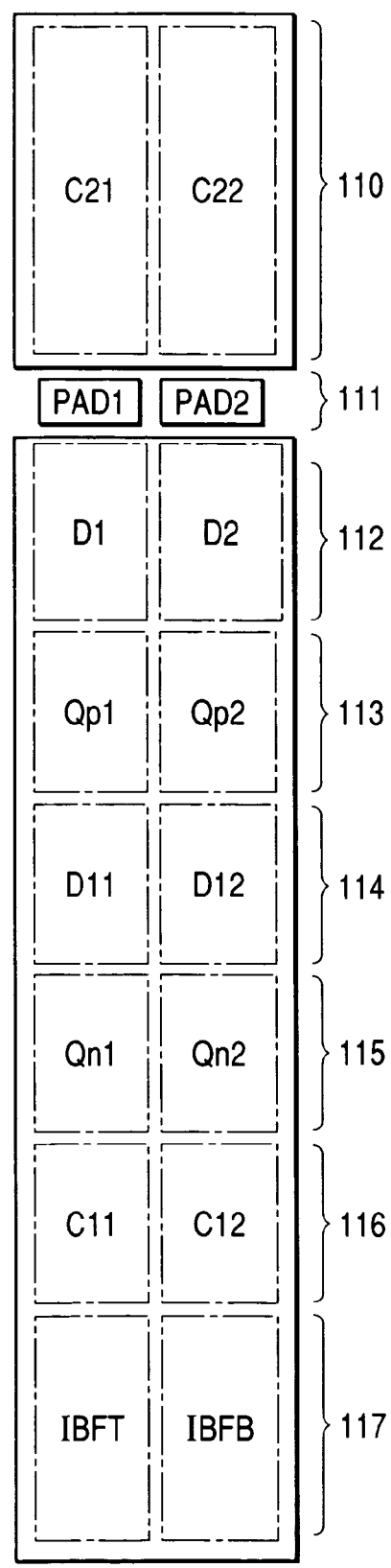
FIG. 17 is a top view of an input/output buffer laid out in the gate array shown in FIG. 16.

FIG. 17 shows an expanded layout of one of the input/output circuits I/O.

As shown in FIG. 17, an input/output buffer cell I/O is formed over regions 111 to 117. In the region 111, external terminal pads PAD1 and PAD2 are formed. In the region 112, electrostatic discharge protection diodes D1 and D2 used as parts of an input circuit are formed. In the region 113, P-channel MOSFETs Qp1 and Qp2 used parts of an output buffer circuit are formed. In the region 114, electrostatic discharge protection diodes D11 and D12 used as parts of the output buffer circuit are formed. In the region 115, N-channel MOSFETs Qn1 and Qn2 used as parts of the output buffer circuit are formed. In the region 116, bypass capacitors C11 and C12 used as parts of a pre-buffer circuit are formed. And, in the region 117, elements used as parts of a differential input circuit IBFT/IBFB as shown in FIG. 1 are formed. In addition, the input/output circuit I/O also includes another region 110 in which bypass capacitors for an output circuit C21 and C22 are formed outside the pads PAD1 and PAD2 respectively. In this embodiment, the capacity of each of the bypass capacitors for an output circuit is expected to be about 100 pF, which is enough to stabilize the power supply.

As shown in FIG. 17, each of the regions 112 to 117 is paired with another to enable input/output of differential signals. One of the paired element regions is used for true side signals and the other is used for bar side signals. It is also possible to use only one of the paired regions to form a circuit for single signals.

If a differential input circuit is to be formed with input/output circuits I/O as shown in FIG. 17, the regions 111 to 115 may be omitted. In those regions are formed P-channel MOSFETs Qp1 and Qp2, electrostatic discharge protection diodes D11 and D12, and N-channel MOSFETs Qn1 and Qn2 used as parts of an output circuit. Consequently, those regions can be used for forming the terminating resistance elements Re1 and Re2, as well as the resistors R1 and R2 connected to the supply voltage VTT and used to give a bias potential to the gates of the MOSFETs MN4 and MN5 respectively. Concretely, the terminating resistance elements Re1 and Re2 and the dividing resistors R1 and R2 can be formed with a polysilicon layer to be assumed as the gate electrodes of the output buffer P-channel MOSFETs Qp1 and Qp2 or N-channel MOSFETs Qn1 and Qn2.

Even when the resistors R1 and R2 connected to the supply voltage VTT and used to give a bias potential to the gates of the MOSFETs MN4 and MN5 respectively are replaced with P-channel MOSFETs MP3 and MP4, as well as N-channel MOSFETs MN6 and MN7 for giving a bias potential to the gates of the MN4 and MN5 shown in FIG. 2 respectively, the P-channel MOSFETs Qp1 and Qp2 in the region 113, as well as the N-channel MOSFETs Qn1 and Qn2 in the region 115 can be used to form the above differential input circuit.

In this embodiment, the terminating resistance elements Re1 and Re2 are formed with the polysilicon layer to be assumed as the gate electrodes of the output buffer MOSFETs Qp1 and Qp2. In addition, the P-channel MOSFETs MP3 and MP4 for giving a bias potential to the gates of the differential input MOSFETs MN4 and MN5 respectively are formed with the output buffer P-channel MOSFETs Qp1 and Qp2 while the N-channel MOSFETs MN6 and MN7 connected to the ground potential and used to give a bias potential to the gates of the differential input MOSFETs MN4 and MN5 respectively are formed with output buffer N-channel MOSFETs Qn1 and Qn2.

Furthermore, in this embodiment, it is possible to use the region 114 in which electrostatic discharge protection diodes D11 and D12 are formed, as well as the region 15 in which N-channel MOSFETs Qn1 and Qn2 of the output buffer circuit are formed to form coaxial-cable-like lines L0, L11 to L13 as shown in FIG. 14 assumed as the coupling capacitance elements, that is, the capacitors C1 and C2 for passing high frequency components of input signals.

Note that, however, only the coaxial-cable-like portions of the lines are formed in the regions 114 and 115. The tube-like line assembly consisting of the lines L11 to L31 is formed in regions 112 and 113 up to around the pads PAD1 and PAD2. The input signal transmission line assembly that occupies the regions 112 and 113 may not be a tube-like one. It is possible to form the input signal transmission assembly with one or two of the three metallic layers and form the lines L21 and L22 consisting of intermediate metallic layers as continuous patterns in the lateral direction just like the lines L11 and L31. Even in the regions 112 and 113, the tube-like line assembly formed beforehand enables the coupling capacitance to be changed in accordance with the adjusted length of the core-side line L0, thereby the time constant comes to be set freely and easily in accordance with the subject product.

Figure 18:
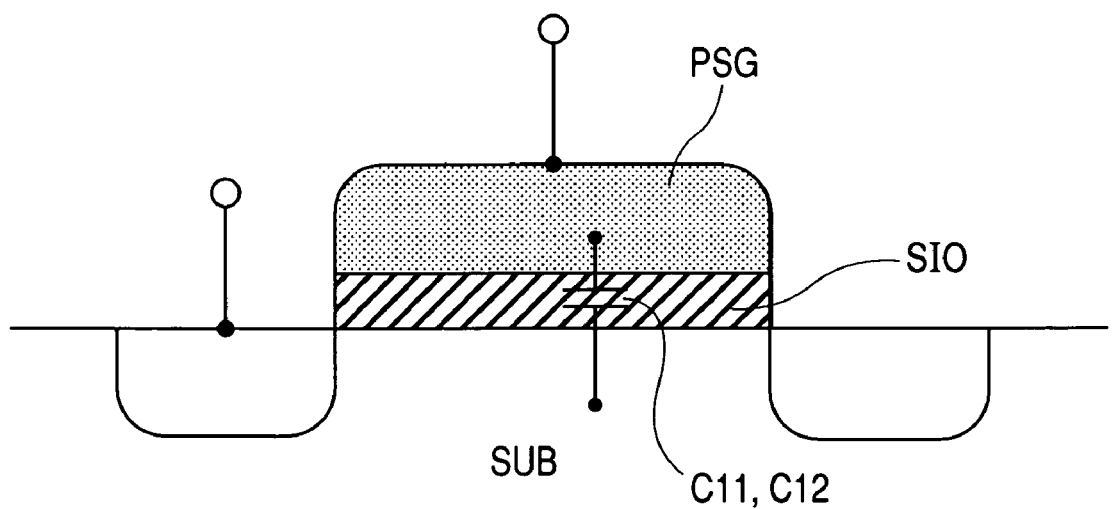
FIG. 18 is a cross sectional view of a structure of a bypass capacitor provided in an input/output buffer block of the gate array in an embodiment of the present invention.

Although not limited specially in this embodiment, each of the bypass capacitors C11 and C12 is configured by a so-called MOS capacitor. A MOS capacitor, as shown in FIG. 18, uses the polysilicon layer PSG of a MOSFET gate electrode as one electrode, the semiconductor substrate SUB as the other electrode, and an oxide film SIO to be assumed as a MOSFET gate insulator as a dielectric. Because the bypass capacitors C11 and C22 are configured and a comparatively thick gate insulator is used as a dielectric such way, a large capacity is obtained from a small area. In addition, no additional process is required to form both C11 and C12 on the semiconductor substrate. In this embodiment, 20 pF to 30 pF are expected as the capacity of both C11 and C12.

Figure 19:
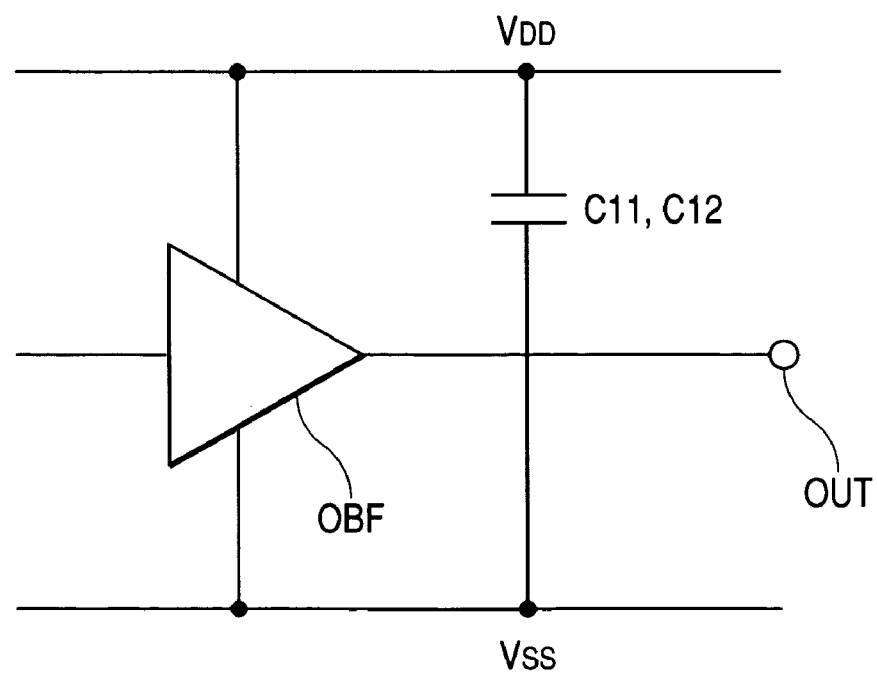
FIG. 19 is a circuit diagram of the connection between an output buffer and a bypass capacitor in the gate array in an embodiment of the present invention.

As shown in FIG. 19, the bypass capacitors C11 and C12 are connected between the power supply line (VDD line) and the ground line (VSS line) laid close to the output buffer circuit OBF and they work respectively to prevent the supply voltage VDD from varying even at a large current flow in the output buffer circuit OBF.

Figure 20:
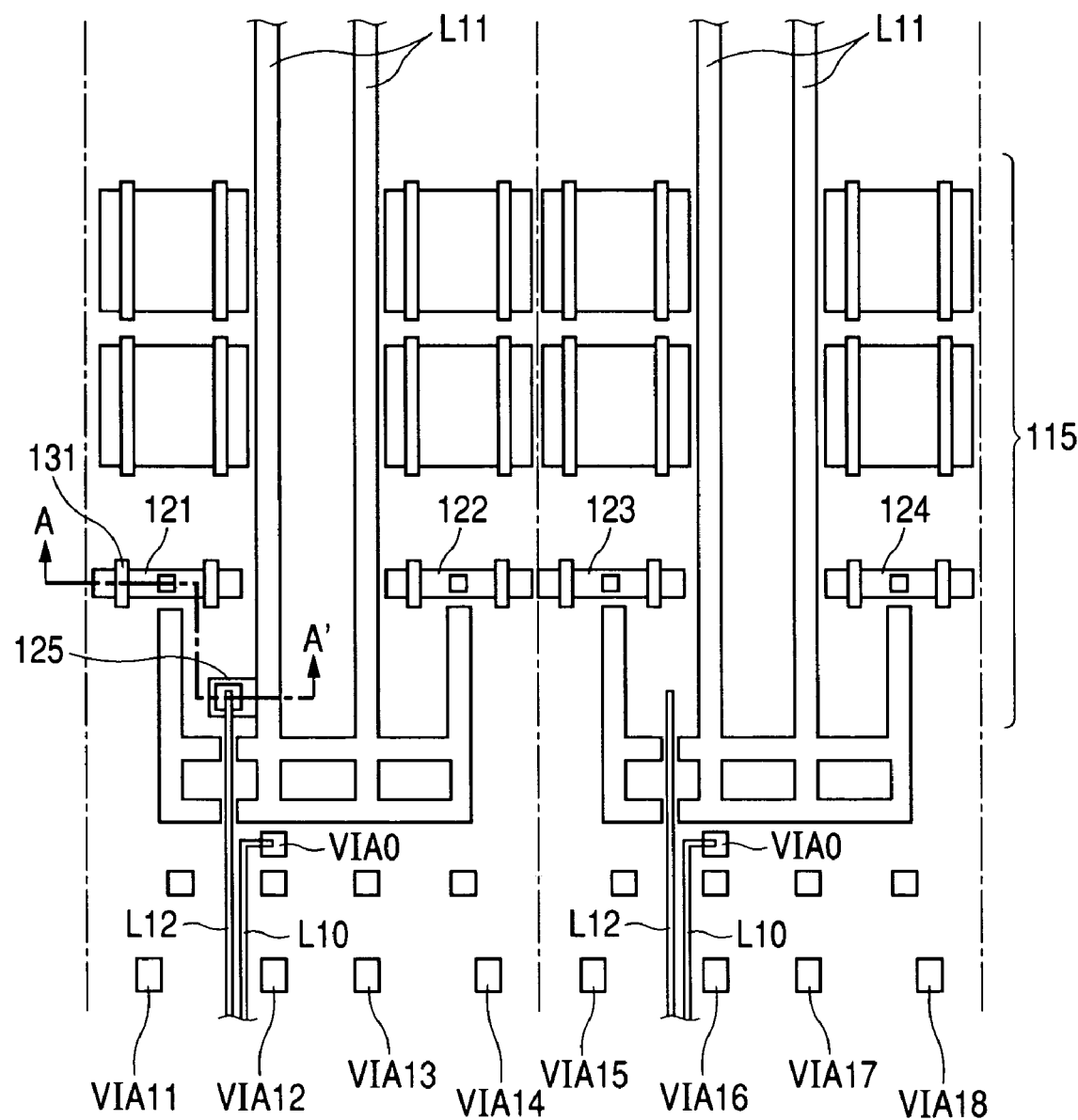
FIG. 20 is a top view of a line pattern formed in the third metallic layer for forming a capacitor for transferring the high frequency components of input signals in the gate array in an embodiment of the present invention.
Figure 21:
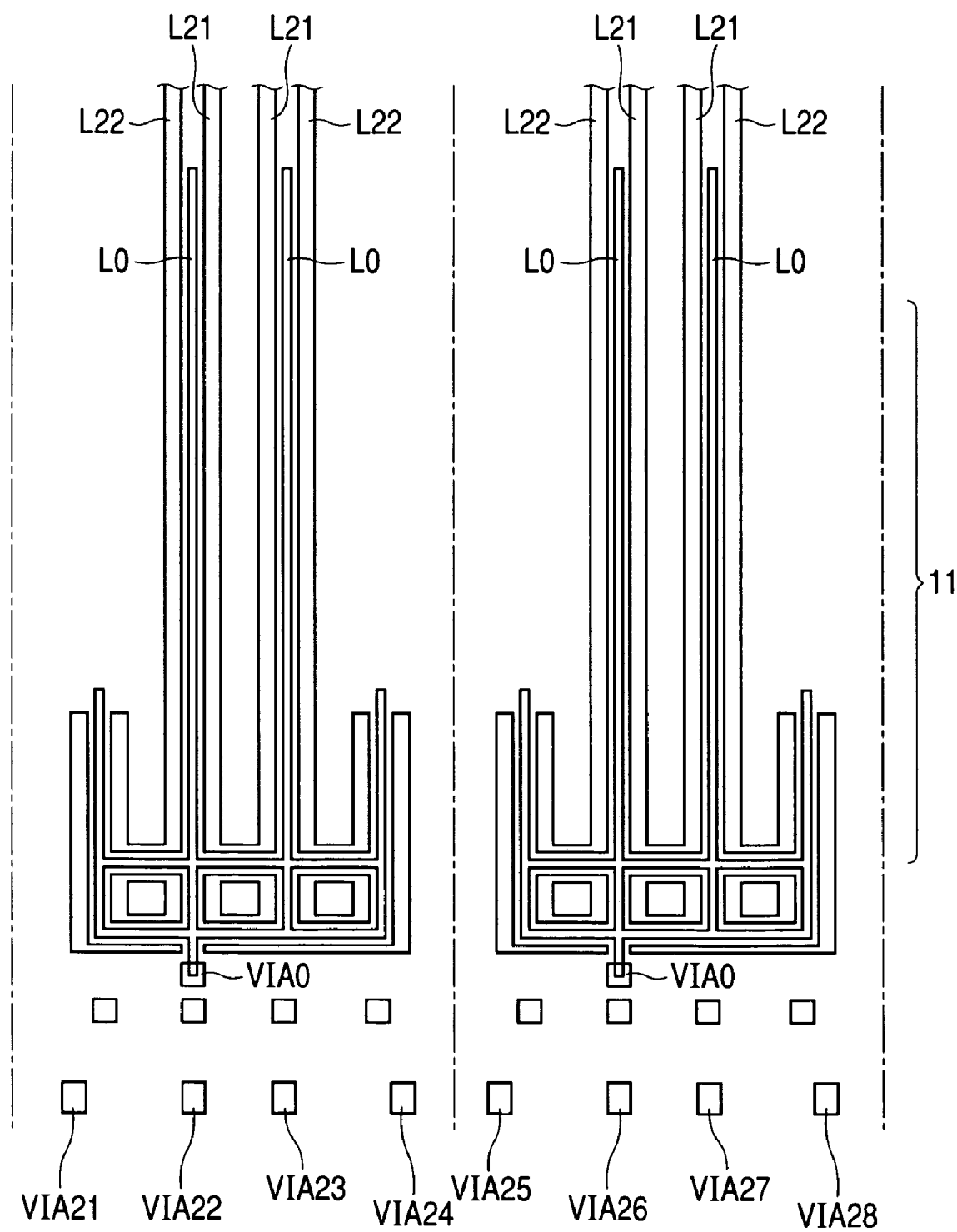
FIG. 21 is a top view of a line pattern formed in the second metallic layer for forming a capacitor for transferring the high frequency components of input signals in the gate array in an embodiment of the present invention.
Figure 22:
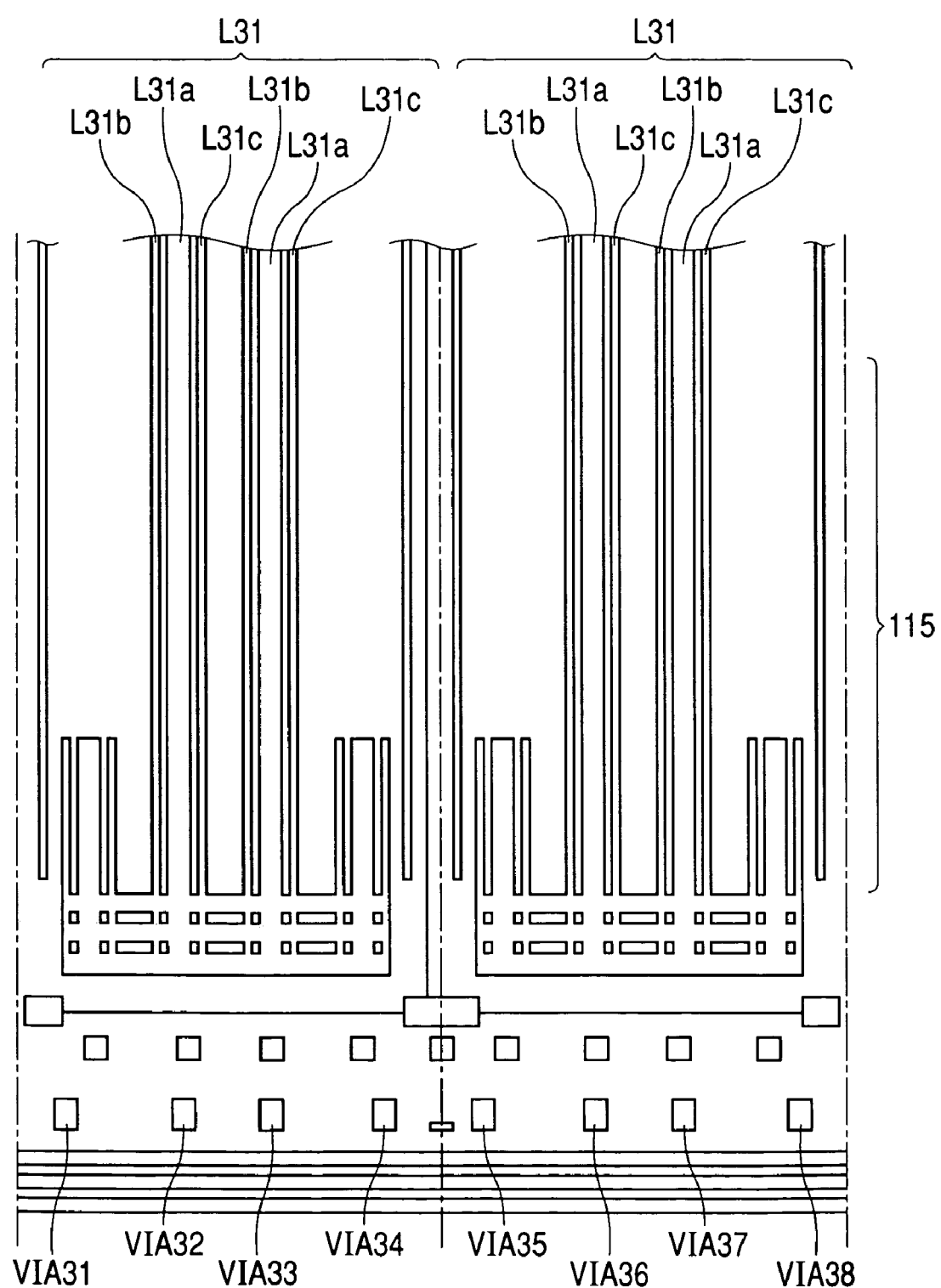
FIG. 22 is a top view of a line pattern formed in the first metallic layer for forming a capacitor for transferring the high frequency components of input signals in the gate array in an embodiment of the present invention.
Figure 23:
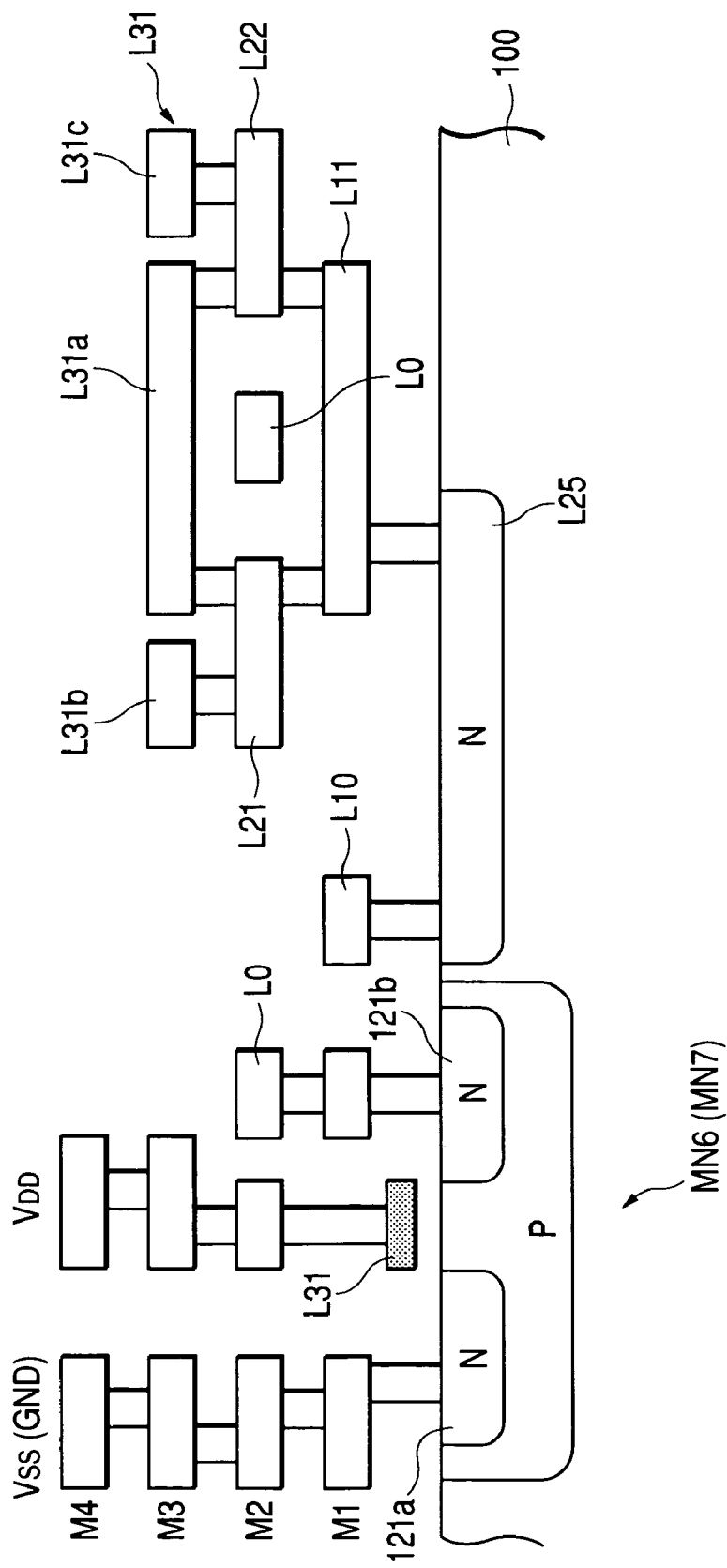
FIG. 23 is a cross sectional view of a structure of the line pattern shown in FIG. 22.
Figure 24:
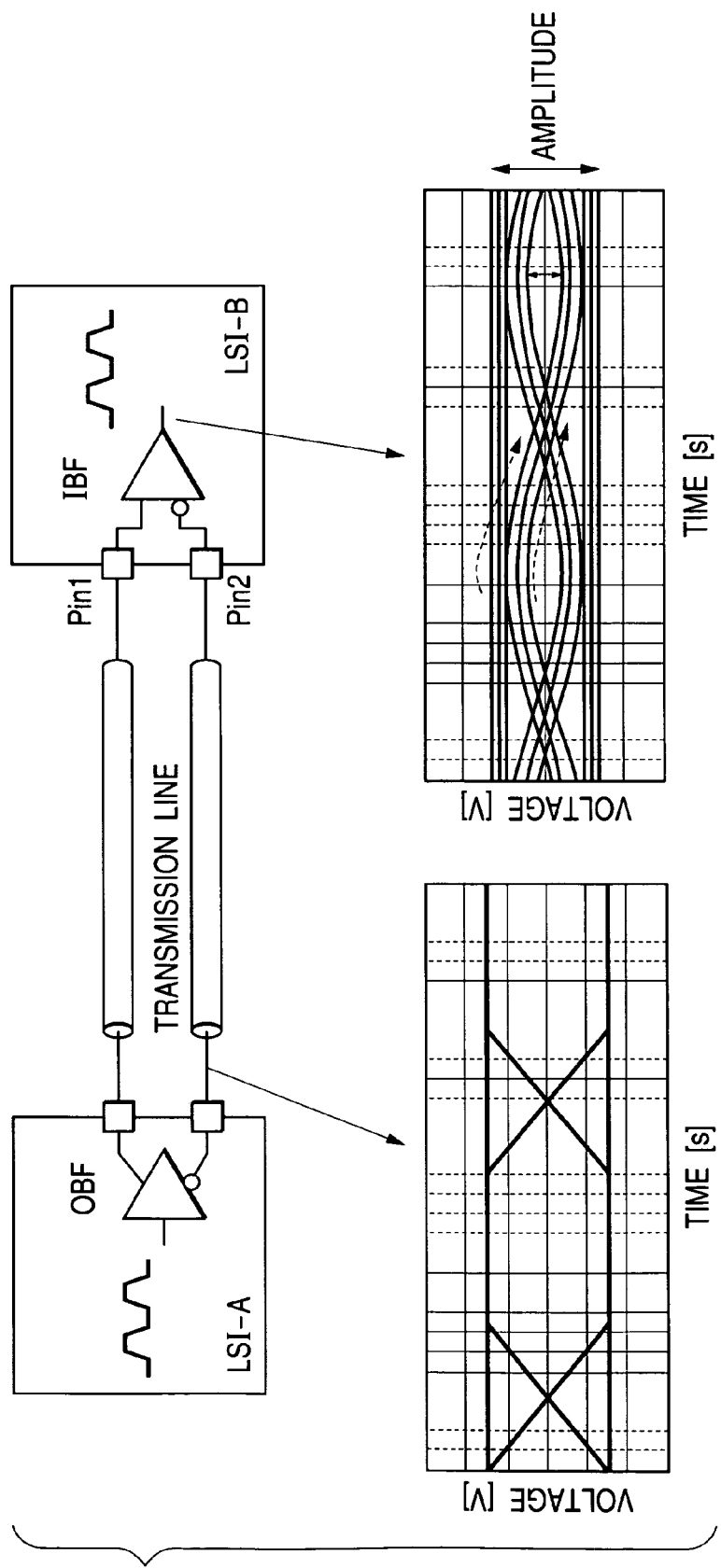
FIG. 24 is a circuit diagram for denoting a signal transmission method with use of differential signals between semiconductor integrated circuits and the waveforms of signals to appear at both input and output terminals.
Figure 25:
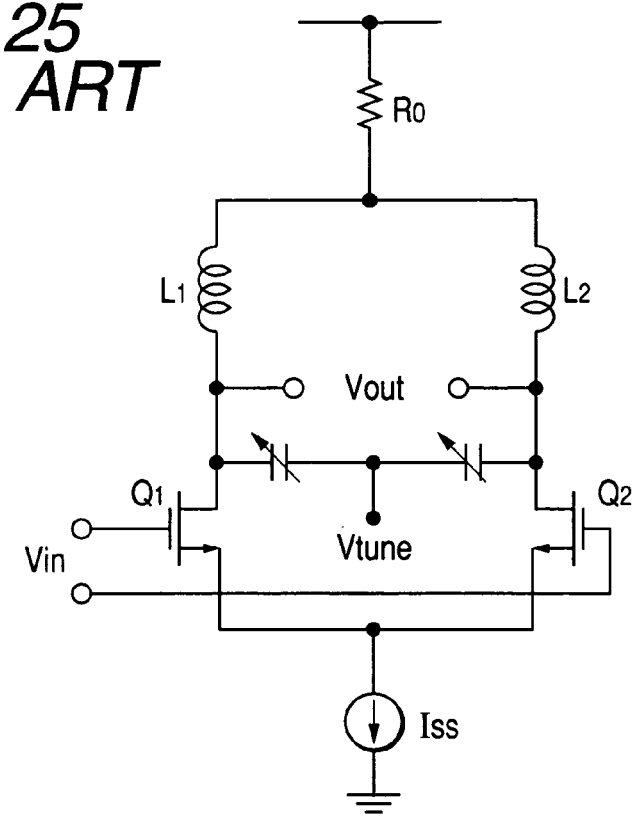
FIG. 25 is a circuit diagram of a conventional differential input circuit.
Figure 26:
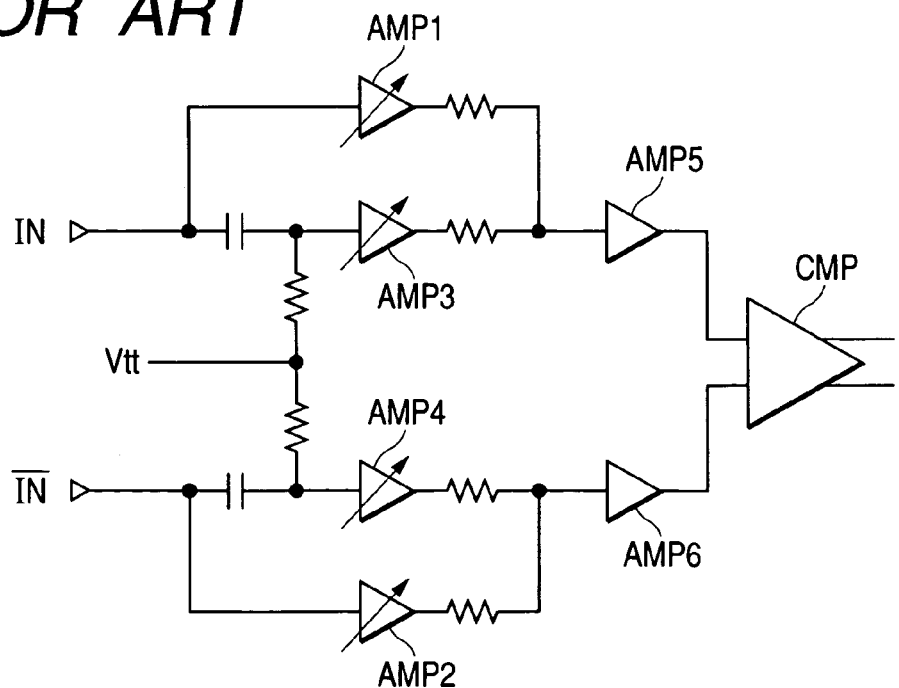
FIG. 26 is another circuit diagram of the conventional differential input circuit.

FIGS. 20 through 22 show concrete patterns of the lines L0, and L11 to L31 used to form coaxial-cable-like coupling capacitance elements formed in the region 115. FIG. 20 shows the line L11 laid in the first metallic layer, FIG. 21 shows the line L0, L21, and L22 laid in the second metallic layer respectively, and FIG. 22 shows the line L31 laid in the third metallic layer. FIG. 23 shows a cross sectional view of the line patterns at an alternate long and short dash line shown in FIG. 22.

As shown in FIG. 21, two lines L0 are laid side by side in parallel corresponding to the two pads PAD1 and PAD2. This is to obtain a larger capacity at a shorter distance. Each pair of the lines L0, and L11 to L31 is parted right and left at its lower end, then extended to be turned up from the lower end. This is to connect the line L0 to the N-channel MOSFETs MN6 and MN7 formed at the turned-up portions to apply the bias potential to the gates of the differential input MOSFETs MN4 and MN5.

In FIG. 20, reference numerals 121 to 124 denote diffusion layers to be used as the sources or drains of the N-channel MOSFETs MN6 and MN7. In FIGS. 20 and 23, reference numeral 131 denotes the polysilicon electrode of the N-channel MOSFET MN6 (MN7). This gate electrode is connected to the power supply line (VDD) formed in the fourth metallic layer M4 through the third, second, and first metallic layers M3, M2, and M1. The diffusion layer 124a is connected to the power supply line (VSS) formed in the fourth metallic layer M4 through the third, second, and first metallic layers M3, M2, and M1. The diffusion layer 124a is also connected to the line L0 through the second and first metallic layers M2 and M1.

The diffusion layers 121 to 124, as well as the gate electrodes 131, etc. are used as output N-channel MOSFETs when they are elements of an output circuit. In the region 151, a plurality of N-channel MOSFET diffusion layers and gate electrodes are formed. When those diffusion layers and electrodes are elements of an output circuit, those MOSFETs are connected to each another in parallel so that they work as one large MOSFET. When those diffusion layers and electrodes are elements of an input circuit, one or more of the plurality of MOSFETs are used to form resistance dividing N-channel MOSFETs MN6 and MN7.

Although not shown, a plurality of P-channel MOSFETs are also formed beforehand in the region 113 in which P-channel MOSFETs Qp1 and Qp2 that are elements of an output buffer circuit are formed. And, when those P-channel MOSFETs are elements of an output buffer actually, they are connected to each another in parallel so that they work together as one large MOSFET. Consequently, when they are elements of an input circuit, the polysilicon layer that functions as the gate electrodes of some of the P-channel MOSFETs are used to form the terminal resistances Re1 and Re2 and some of the rest output buffer P-channel MOSFETs are used to form the P-channel MOSFETs MP3 and MP4 that apply a bias potential to the gates of the differential input MOSFETs MN4 and MN5 respectively.

In FIG. 20, the line L10 is connected to the line L0 to transfer the high frequency components of input signals to the gate terminals of the differential input MOSFETs MN4 and MN5. The line L12 is connected to the line L11 to transfer the low frequency components of input signals to the differential input MOSFETs MN1 and MN2. Both lines L0 and L10 are also connected to each other through the via-hole VIA0.

Although not shown in FIGS. 1 through 11, the line L10 is connected to the line L11 through the diffusion layer (resistor) 125 formed on the surface of the substrate 100 (see FIG. 23) for electrostatic discharge protection. The PN junction between this diffusion layer 125 and the substrate 100 may be regarded as electrostatic discharge protection diode D1 or D2 shown in FIG. 1. Furthermore, in this embodiment, the line L31 (L31a to L31c) in the third metallic layer is formed wider than the line L11 in the first metallic layer. Consequently, the parasitic capacity is prevented from rising above that assumed when the line L11 closer to the substrate 100 is wider than the line L31. As a result, the capacity between the line L0 and each of the lines L11 to L31 can be set larger.

As shown in FIG. 23, the line L13 formed in the third metallic layer is divided into three parallel lines L31a to L31c. This is because the width of the line L31 is wider than the maximum line width decided by the design rule. On the other hand, the width of each of the lines L11 to L31 is decided in accordance with the target current flowing through the corresponding terminating resistance element. However, each line needs a certain line width to reduce the current density so as to minimize the influence by the electro-migration. In this embodiment, while the line L31 is divided as described above, since the width exceeds the maximum line width decided by the design rule, the line L31 may also be a single line.

In FIGS. 20 through 22, VIA11 to VIA18, VIA21 to VIA28, and VIA31 to VIA38 are power supply elements for applying an inverse bias to between the substrate and each well region and between the substrate and each diffusion layer respectively by applying the supply voltage VDD to the substrate.

While the preferred embodiments of the present invention has been described, it is to be understood that modifications will be apparent to those skilled in the art without departing from the spirit of the invention. For example, the differential input MOSFETs MN1 and MN2 for amplifying the low frequency components of input signals and the differential input MOSFETs MN3 and MN4 for amplifying the high frequency components of input signals are connected to be paired with each other through their emitters to form a common emitter respectively in the above embodiments. If the frequency of an input signal is high, however, the differential input circuit may omit the differential input MOSFETs MN1 and MN2 for amplifying the low frequency components of input signals. Even in such a case, the input circuit will be able to reduce the attenuation of the signal jitter, thereby supplying quality-improved signals to the object internal circuit.

While a description has been made mainly for a case in which the present invention applies to a gate array input/output buffer, which is the background of the application field of the invention, the present invention may also apply to any of general semiconductor integrated circuits that receive digital signals that are transferred fast.

Typical effects which may be obtained by the present invention, which are disclosed in this document, will be summarized as follows.

According to the present invention, the differential input circuit can amplify both low and high frequency components of input signals, thereby transferring signals accurately to the object internal circuit even when the data is transferred fast while preventing input signals from both amplitude variation and signal jitter increasing to be caused by the dependency on the array of transferred data. Furthermore, in the semiconductor integrated circuit, the capacitor can be formed in a smaller area than the inductor, so that fast input data signals can be received and transferred to the internal circuit free from waveform distortion while suppressing the chip from increasing in size.

Furthermore, each coupling capacitance element is disposed between the first line and the tube-like second line assembly formed so as to enclose the first line are used as a capacitor for transferring low frequency components of input signals to a differential input MOSFET transistor. A capacitor for transferring the high frequency components of input signals can thus be formed without requiring any dedicated area for that.

Some other variations are discussed below.

The semiconductor integrated circuit device wherein said device further includes a bypass capacitor connected between said third line and said fourth line.

The semiconductor integrated circuit device wherein said capacitor uses the same conductor layer of that of the gate electrode of a MOS transistor as an electrode and the same insulator as the fate insulator of a MOS transistor as a dielectric.

The semiconductor integrated circuit device wherein said input circuit further includes: fifth and sixth MOS transistors connected respectively between a first supply voltage terminal and each of gate terminals of said first and second differential input MOS transistors; seventh and eighths MOS transistors connected respectively between a second supply voltage terminal and each of said gate terminals of said first and second differential input MOS transistors.

The semiconductor integrated circuit device wherein elements of said input circuit and elements usable for configuring an output circuit are provided closely to electrodes used as said input terminals while some of said elements usable for configuring said output circuit are used to form said fifth to eighth MOS transistors.

The semiconductor integrated circuit device wherein said device further includes fifth line for receiving a third power supply potential; and wherein the gate electrodes of said pair of differential input MOS transistors are connected to said fifth line through a resistance element respectively.

The semiconductor integrated circuit device wherein elements of said input circuit and elements usable for configuring an output circuit are provided closely to electrodes used as said input terminals while part of said conductive layer used as the gate electrode of a MOS transistor usable for forming said output circuit is used to form said resistance element connected to said fifth line.

The semiconductor integrated circuit device wherein elements of said input circuit and elements usable for forming an output circuit are provided closely to electrodes used as said input terminals while said pair of capacitance elements are formed above a region where said elements usable for configuring said output circuit are formed.

The semiconductor integrated circuit device wherein each of said first and second load elements is formed with a MOS transistor.

The semiconductor integrated circuit device wherein said device further includes an electrostatic protecting capacitance element connected to said pair of input terminals respectively.

The semiconductor integrated circuit device wherein said device further includes a plurality of basic cells usable for forming a logic circuit.

The semiconductor integrated circuit device provided with a differential input circuit wherein said input circuit includes: a first input MOS transistor having a gate terminal connected to a first input terminal through a first capacitance element; a second input MOS transistor having a gate terminal connected to a second input terminal through a second capacitance element and having a source terminal connected to the source terminal of said first input MOS transistor to form a common source terminal; a first load element connected between the drain terminal of said first input MOS transistor and said first supply voltage terminal; a second load element connected between the drain terminal of said second input MOS transistor and said first supply voltage terminal; and a current source connected between a second supply voltage terminal and a common source terminal of said first and second input MOS transistors.

A semiconductor integrated circuit device, including a capacitance element, wherein the capacitance element comprises a first line (L11) formed with a conductor layer formed on an insulator on the main surface of a semiconductor substrate; a first insulator layer formed on the first line; and a second line (L0) formed on the first insulator layer; wherein the first line is connected to a gate of a MOS transistor; and wherein the second line is connected to a terminal.

The semiconductor integrated circuit device wherein the first line formed so as to enclose the second line, and the first insulator layer is formed between the first line and the second line.

The semiconductor integrated circuit device wherein the capacitance elements further comprises a second insulator layer formed on the second line; and
 a third line (L31) formed on the second insulator layer; wherein the third line is connected the terminal.

The semiconductor integrated circuit device wherein the capacitance elements further comprises: a fourth line (L21) formed on the first insulator layer; a first connection line (VIA1) to connect between the first line and the fourth line; and a second connection line (VIA3) to connect between the third line and the fourth line.

The semiconductor integrated circuit device wherein the capacitance element further comprises: a fifth line (L21) formed on the first insulator layer, the fourth and fifth lines disposed at both sides of the second line; a third connection line (VIA2) to connect between the first line and the fifth line; and a fourth connection line (VIA4) to connect between the third line and the fifth line.

The semiconductor integrated circuit device wherein the MOS transistor is included an input circuit.

The semiconductor integrated circuit device according to claim 1, wherein the first line is wider than the second line.

The semiconductor integrated circuit device wherein the third line is wider than the second line.

The semiconductor integrated circuit device wherein the capacitance area is located in an I/O area.

Other variations of the present invention are possible without departing from the scope of the disclosure.

What is claimed is:

1. A semiconductor integrated circuit device, comprising:
   a first line to supply a first power supply potential;
   a second line to supply a second power supply potential; and
   an input circuit connected between the first line and the second line,
   wherein the input circuit comprises:
      a pair of input terminals;
      a pair of first capacitance elements connected to the pair of input terminals;
      a pair of first differential MOS transistors provided with a pair of gate electrodes connected to the pair of input terminals through the pair of first capacitance elements respectively, and with a pair of source electrodes connected to each other to form a common source, and with a pair of drain electrodes;
      a pair of load elements connected between each of the pair of drain electrodes of the first differential MOS transistors and the first line;
      a current source connected between the common source of the first differential MOS transistors and the second line;
      a pair of second differential MOS transistors provided with a pair of gate electrodes connected to the pair of input terminals respectively, with a pair of source electrodes connected to each other to form a common source, and with a pair of drain electrodes,
      wherein the pair of load elements are connected between each of the pair of drain electrodes of the second differential MOS transistors and the first line, and
      wherein the current source is connected between the common source of the second differential MOS transistors and the second line.

2. The semiconductor integrated circuit device according to claim 1, wherein said device further comprises:
   a third line to supply a third power supply potential; and
   a pair of first resistors connected between each of the pair of gate electrodes of the first differential MOS transistors and the third line.

3. The semiconductor integrated circuit device according to claim 2, wherein said device further comprises:
   a fourth line to supply a fourth power supply potential; and
   a pair of second resistors connected between each of the pair of input terminals and the fourth line;
   wherein the resistance values of the pair of first resistors are set larger than those of the pair of second resistors.

4. The semiconductor integrated circuit device according to claim 1,
   wherein said device further comprises second capacitance elements connected between the first line and the second line;
   wherein each of the pair of first capacitance elements is formed with a metal-insulator-metal structure; and wherein each of the second capacitance elements is formed with a MOS structure.

5. The semiconductor integrated circuit device according to claim 3, wherein each of the pair of the first capacitance elements comprises:
a fifth line formed with a conductor layer formed on an insulator on the main surface of a semiconductor substrate;
a first insulator layer formed on the fifth line; and
a sixth line formed on the first insulator layer;
wherein the sixth line is connected to the gate electrode of its corresponding first differential MOS transistor; and
wherein the fifth line is connected to its corresponding one of the pair of input terminals.

6. The semiconductor integrated circuit device according to claim 5,
wherein the fifth line is formed so as to enclose the sixth line, and the first insulator layer is formed between the fifth line and the sixth line.

7. The semiconductor integrated circuit device according to claim 5, wherein each of the pair of first capacitance elements further comprises:
a second insulator layer formed on the sixth line; and
a seventh line formed on the second insulator layer,
wherein the seventh line is connected to its corresponding one of the pair of input terminals.

8. The semiconductor integrated circuit device according to claim 7, wherein each of the pair of first capacitance elements further comprises:
a eighth line formed on the first insulator layer;
a first connection line to connect between the fifth line and the eighth line; and
a second connection line to connect between the seventh line and the eighth line.

9. The semiconductor integrated circuit device according to claim 8, wherein each of the pair of first capacitance elements further comprises:
a ninth line formed on the first insulator layer, the eighth and ninth lines disposed at both sides of the sixth line;
a third connection line to connect between the fifth line and the ninth line; and
a fourth connection line to connect between the seventh line and the ninth line.

10. The semiconductor integrated circuit device according to claim 5, wherein the fifth line is wider than the sixth line.

11. The semiconductor integrated circuit device according to claim 7, wherein the seventh line is wider than the sixth line.

12. The semiconductor integrated circuit device according to claim 1, wherein a differential signal is inputted to the pair of input terminals respectively.

13. The semiconductor integrated circuit device according to claim 1, wherein the first power supply potential is higher than the second power supply potential.

14. A semiconductor integrated circuit device provided with first and second input terminals and an input circuit, wherein the input circuit comprises:
a first MOS transistor having a gate connected to the first input terminal through a first capacitance element;
a second MOS transistor having a gate connected to the second input terminal through a second capacitance element and having a source connected to the source of the first MOS transistor to form a common source;
a third MOS transistor having a gate connected to the first input terminal;
a fourth MOS transistor having a gate connected to the second input terminal and having a source connected to the source of the third MOS transistor to form a common source;
a first load element connected between a drain of the first MOS transistor and a first supply potential node,
wherein the first load element is connected between the first supply potential node and each of the drains of the first and third MOS transistors;
a second load element connected between a drain of the second MOS transistor and the first supply potential node,
wherein the second load element is connected between the first supply potential node and each of the drains of the second and fourth MOS transistors; and
a first current source connected between a second supply potential node and the common source of the first and second MOS transistors,
wherein the first current source is connected between the second supply potential node and each common source of the first to fourth MOS transistors.

15. The semiconductor integrated circuit device according to claim 14, wherein the input circuit further includes:
first and second resistance elements connected between a third supply potential node and each of the gates of the first and second MOS transistors.

16. The semiconductor integrated circuit device according to claim 15:
wherein third and fourth resistance elements are connected respectively between a fourth supply potential node and each of the pair of input terminals, and
wherein the resistance values of the pair of first and second resistance elements are set larger than those of the pair of third and fourth resistance elements.

17. The semiconductor integrated circuit device according to claim 14, wherein the input circuit further includes:
fifth and sixth MOS transistors connected respectively between the first supply potential node and each of the gates of the first and second MOS transistors; and
seventh and eighth MOS transistors connected respectively between the second supply potential node and each of the gates of the first and second MOS transistors.

18. The semiconductor integrated circuit device according to claim 14, wherein each of said first and second load elements is formed with a MOS transistor.

19. The semiconductor integrated circuit device according to claim 15,
wherein the first power supply potential of the first supply potential node is higher than the second power supply potential of the second supply potential node, and
wherein the third power supply potential of the third supply potential node is higher than a potential obtained by adding the threshold voltage of the first or second MOS transistors to the second power supply potential and lower than the first power supply potential.

20. The semiconductor integrated circuit device according to claim 17, wherein the input circuit further comprises:
a ninth MOS transistor having a gate connected to the first input terminal through the first capacitance element;
a tenth MOS transistor having a gate connected to the second input terminal through the second capacitance element and having a source connected to the source of the ninth MOS transistor to form a common source;
an eleventh MOS transistor having a gate connected to the first input terminal;

a twelfth MOS transistor having a gate connected to the second input terminal and having a source connected to the source of the eleventh MOS transistor to form a common source;

a third load element connected between the drains of the ninth and eleventh MOS transistors and the first supply potential node;

a fourth load element connected between the drains of the tenth and twelfth MOS transistors and the first supply potential node; and a second current source connected between the second supply potential node and the common sources of the ninth to twelfth MOS transistors.

21. The semiconductor integrated circuit device according to claim 20, wherein the input circuit further comprises:

a thirteenth MOS transistor having a gate connected to the drain of the first MOS transistor;

a fourteenth MOS transistor having a gate connected to the drain of the tenth MOS transistor and having a source connected to the source of the thirteenth MOS transistor to form a common source;

a fifth load element connected between the drain of the thirteenth MOS transistor and the first supply potential node;

a sixth load element connected between the drain of the fourteenth MOS transistor and the first supply potential node; and a third current source connected between the second supply potential node and the common source of the thirteenth and fourteenth MOS transistors.

* * * * *